United States Patent
Yamada et al.

(10) Patent No.: US 11,790,967 B2
(45) Date of Patent: Oct. 17, 2023

(54) MAGNETIC DOMAIN WALL DISPLACEMENT ELEMENT, MAGNETIC RECORDING ARRAY, AND SEMICONDUCTOR DEVICE

(71) Applicant: TDK CORPORATION, Tokyo (JP)

(72) Inventors: Shogo Yamada, Tokyo (JP); Tatsuo Shibata, Tokyo (JP); Yugo Ishitani, Tokyo (JP)

(73) Assignee: TDK CORPORATION, Tokyo (JP)

( * ) Notice: Subject to any disclaimer, the term of this patent is extended or adjusted under 35 U.S.C. 154(b) by 290 days.

(21) Appl. No.: 17/420,053

(22) PCT Filed: May 15, 2020

(86) PCT No.: PCT/JP2020/019387
§ 371 (c)(1),
(2) Date: Jun. 30, 2021

(87) PCT Pub. No.: WO2020/230877
PCT Pub. Date: Nov. 19, 2020

(65) Prior Publication Data
US 2022/0051708 A1    Feb. 17, 2022

(30) Foreign Application Priority Data

May 15, 2019 (JP) .................................. 2019-092181
Mar. 30, 2020 (JP) .................................. 2020-061064

(51) Int. Cl.
*G11C 11/16* (2006.01)
*H01L 29/82* (2006.01)
(Continued)

(52) U.S. Cl.
CPC ........ *G11C 11/161* (2013.01); *G11C 11/1675* (2013.01); *H01L 29/82* (2013.01);
(Continued)

(58) Field of Classification Search
CPC ... G11C 11/161; G11C 11/1675; G11C 11/15; H01L 29/82; H01L 27/105; H10N 50/10
See application file for complete search history.

(56) References Cited

U.S. PATENT DOCUMENTS

2008/0137405 A1   6/2008  Ohno et al.
2011/0199818 A1   8/2011  Fukami et al.
(Continued)

FOREIGN PATENT DOCUMENTS

JP    2010-219104 A   9/2010
JP       5397384 B2   1/2014
(Continued)

OTHER PUBLICATIONS

NPL/ Translation for Written Opinion of the International Searching Authority, PCT/JP2020/019387, dated Jul. 7, 2020 (Year: 2020).*
(Continued)

*Primary Examiner* — Mushfique Siddique
(74) *Attorney, Agent, or Firm* — Oliff PLC

(57) ABSTRACT

A magnetic domain wall displacement element includes a first ferromagnetic layer, a second ferromagnetic layer extending in a second direction and magnetically recordable, a nonmagnetic layer, and a first conductive part having a first intermediate layer and a second conductive part having a second intermediate layer, in which the first intermediate layer is sandwiched between first and second magnetization regions and exhibiting first and second magnetization directions, the second intermediate layer is sandwiched between a third magnetization region and exhibiting the second magnetization direction and a fourth magnetization region exhibiting the first magnetization direction in the first direction, and an area of the first magnetization region is larger than an area of the second magnetization region and an area of the third magnetization region is smaller than an area of the fourth magnetization region in a cross section in the first direction and the second direction.

19 Claims, 24 Drawing Sheets

(51) Int. Cl.
    *H10N 50/10*    (2023.01)
    *H01L 27/105*    (2023.01)
    *G11C 11/15*    (2006.01)

(52) U.S. Cl.
    CPC .............. *H10N 50/10* (2023.02); *G11C 11/15* (2013.01); *H01L 27/105* (2013.01)

(56) References Cited

U.S. PATENT DOCUMENTS

| | | | |
|---|---|---|---|
| 2012/0278582 A1* | 11/2012 | Fukami | G11C 11/5607 |
| | | | 711/E12.001 |
| 2013/0113058 A1 | 5/2013 | Fukami et al. | |
| 2020/0044141 A1* | 2/2020 | Yamada | H10N 50/80 |
| 2020/0105310 A1 | 4/2020 | Ashida et al. | |

FOREIGN PATENT DOCUMENTS

| | | |
|---|---|---|
| JP | 5445970 B2 | 3/2014 |
| JP | 6499798 B1 | 4/2019 |
| WO | 2005/069368 A1 | 7/2005 |
| WO | 2009/122990 A1 | 10/2009 |
| WO | 2011/118395 A1 | 9/2011 |

OTHER PUBLICATIONS

JP WO2009/122990 A1 Translation copy relied upon (Year: 2009).*
Jul. 7, 2020 International Search Report issued in International Patent Application No. PCT/JP2020/019387.
English Translation of May 5, 2023 Office Action issued in Chinese Patent Application No. 202080010360.3.

* cited by examiner

MAGNETIC DOMAIN WALL DISPLACEMENT ELEMENT, MAGNETIC RECORDING ARRAY, AND SEMICONDUCTOR DEVICE

BACKGROUND

Field of the Invention

The present invention relates to a magnetic domain wall displacement element, a magnetic recording array, and a semiconductor device.

Description of Related Art

Attention has been focused on next-generation non-volatile memories that will replace a flash memory or the like in which limits on miniaturization have been apparent. For example, magnetoresistive random access memories (MRAMs), resistive random access memories (ReRAMs), phase change random access memories (PCRAMs), and the like are known as next-generation non-volatile memories.

MRAMs utilize a change in resistance value caused by a change in a magnetization direction for data recording. In order to realize an increase in capacity of a recording memory, miniaturization of elements constituting the memory and multivalued recording bits per element constituting the memory have been studied.

Patent Document 1 and Patent Document 2 disclose a magnetic domain wall displacement element capable of recording data in multiple values or digitally by causing a magnetic domain wall to be displaced. Also, Patent Document 1 and Patent Document 2 disclose that magnetization fixed regions for limiting a displacing range of the magnetic domain wall are disposed at both ends of a data recording layer (magnetization free layer). The magnetization fixed regions disposed at both ends have different orientation directions of magnetization.

CITATION LIST

Patent Literature

[Patent Document 1] Japanese Patent Publication No. 5397384
[Patent Document 2] Japanese Unexamined Patent Application, First Publication No. 2010-219104

SUMMARY

An initial state of an element can be obtained, for example, by applying an external magnetic field. However, when orientation directions of magnetizations of two magnetization fixed regions are different from each other, it is difficult to make an initial state by simply applying a magnetic field in one direction. When a magnetic field in two directions is applied to stabilize the two magnetization fixed regions, a portion in which a magnetization is oriented in a direction different from a desired magnetization direction may be generated, and reliability of the element may be reduced.

The present invention has been made in view of the above problems and provides a magnetic domain wall displacement element, a magnetic recording array, and a semiconductor device in which an initial state is easily defined.

The present invention provides the following means to solve the above-described problems.

(1) A magnetic domain wall displacement element according to a first aspect includes a first ferromagnetic layer, a second ferromagnetic layer positioned in a first direction with respect to the first ferromagnetic layer, extending in a second direction different from the first direction, and magnetically recordable, a nonmagnetic layer positioned between the first ferromagnetic layer and the second ferromagnetic layer, and a first conductive part including a first intermediate layer and a second conductive part including a second intermediate layer which are spaced apart from each other and connected to the second ferromagnetic layer, in which the first intermediate layer is sandwiched between a first magnetization region exhibiting a first magnetization direction and a second magnetization region exhibiting a second magnetization direction different from the first magnetization direction in the first direction, the second intermediate layer is sandwiched between a third magnetization region exhibiting the second magnetization direction and a fourth magnetization region exhibiting the first magnetization direction in the first direction, and an area of the first magnetization region is larger than an area of the second magnetization region and an area of the third magnetization region is smaller than an area of the fourth magnetization region in a cross-section in the first direction and the second direction.

(2) In the magnetic domain wall displacement element according to the above-described aspect, the area of the first magnetization region may be larger than the area of the third magnetization region.

(3) In the magnetic domain wall displacement element according to the above-described aspect, a first surface of the third magnetization region on a side opposite to a surface of the third magnetization region in contact with the second intermediate layer in the first direction may be inclined with respect to a surface perpendicular to the first direction.

(4) In the magnetic domain wall displacement element according to the above-described aspect, a length of the second conductive part in the second direction may be longer than a length of the first conductive part in the second direction.

(5) In the magnetic domain wall displacement element according to the above-described aspect, the area of the second magnetization region may be different from the area of the fourth magnetization region.

(6) In the magnetic domain wall displacement element according to the above-described aspect, the area of the second magnetization region may be equal to the area of the fourth magnetization region.

(7) In the magnetic domain wall displacement element according to the above-described aspect, the first magnetization region and the third magnetization region may be each formed of a single material.

(8) In the magnetic domain wall displacement element according to the above-described aspect, the first magnetization region and the third magnetization region may be each formed of a plurality of layers.

(9) In the magnetic domain wall displacement element according to the above-described aspect, the first magnetization region and the third magnetization region may include the same material as the second ferromagnetic layer.

(10) In the magnetic domain wall displacement element according to the above-described aspect, a height position in the first direction of the first intermediate layer and a height position in the first direction of the second intermediate layer may be the same.

(11) In the magnetic domain wall displacement element according to the above-described aspect, the first conductive part and the second conductive part may extend in opposite directions in the first direction with respect to the second ferromagnetic layer.

(12) In the magnetic domain wall displacement element according to the above-described aspect, a distance in the second direction between a conductive part of the first conductive part or the second conductive part extending in the same direction as a direction in which the first ferromagnetic layer is laminated with respect to the second ferromagnetic layer and the first ferromagnetic layer may be longer than a distance in the second direction between a conductive part of the first conductive part or the second conductive part extending in a direction opposite to a side in which the first ferromagnetic layer is laminated with respect to the second ferromagnetic layer and the first ferromagnetic layer.

(13) In the magnetic domain wall displacement element according to the above-described aspect, a cross-sectional area of the first magnetization region and the third magnetization region taken along a plane perpendicular to the second direction may be larger than a cross-sectional area of the second ferromagnetic layer taken along a plane perpendicular to the second direction.

(14) The magnetic domain wall displacement element according to the above-described aspect may further include a third ferromagnetic layer between the nonmagnetic layer and the second ferromagnetic layer.

(15) In the magnetic domain wall displacement element according to the above-described aspect, the first conductive part and the second conductive part may extend in the first direction with respect to the second ferromagnetic layer, and the first magnetization region may protrude with respect to the second ferromagnetic layer toward a side opposite to a side in which the first conductive part extends, or the third magnetization region may protrude with respect to the second ferromagnetic layer toward a side opposite to a side in which the second conductive part extends.

(16) A magnetic recording array according to a second aspect may include a plurality of magnetic domain wall displacement elements according to the above-described aspect.

(17) A semiconductor device according to a third aspect includes a magnetic domain wall displacement element according to the above-described aspect, and a plurality of switching elements electrically connected to the magnetic domain wall displacement element.

According to the magnetic domain wall displacement element, the magnetic recording array, and the semiconductor device according to the above-described aspects, it is easy to define an initial state of the element.

DETAILED DESCRIPTION

Figure 1:
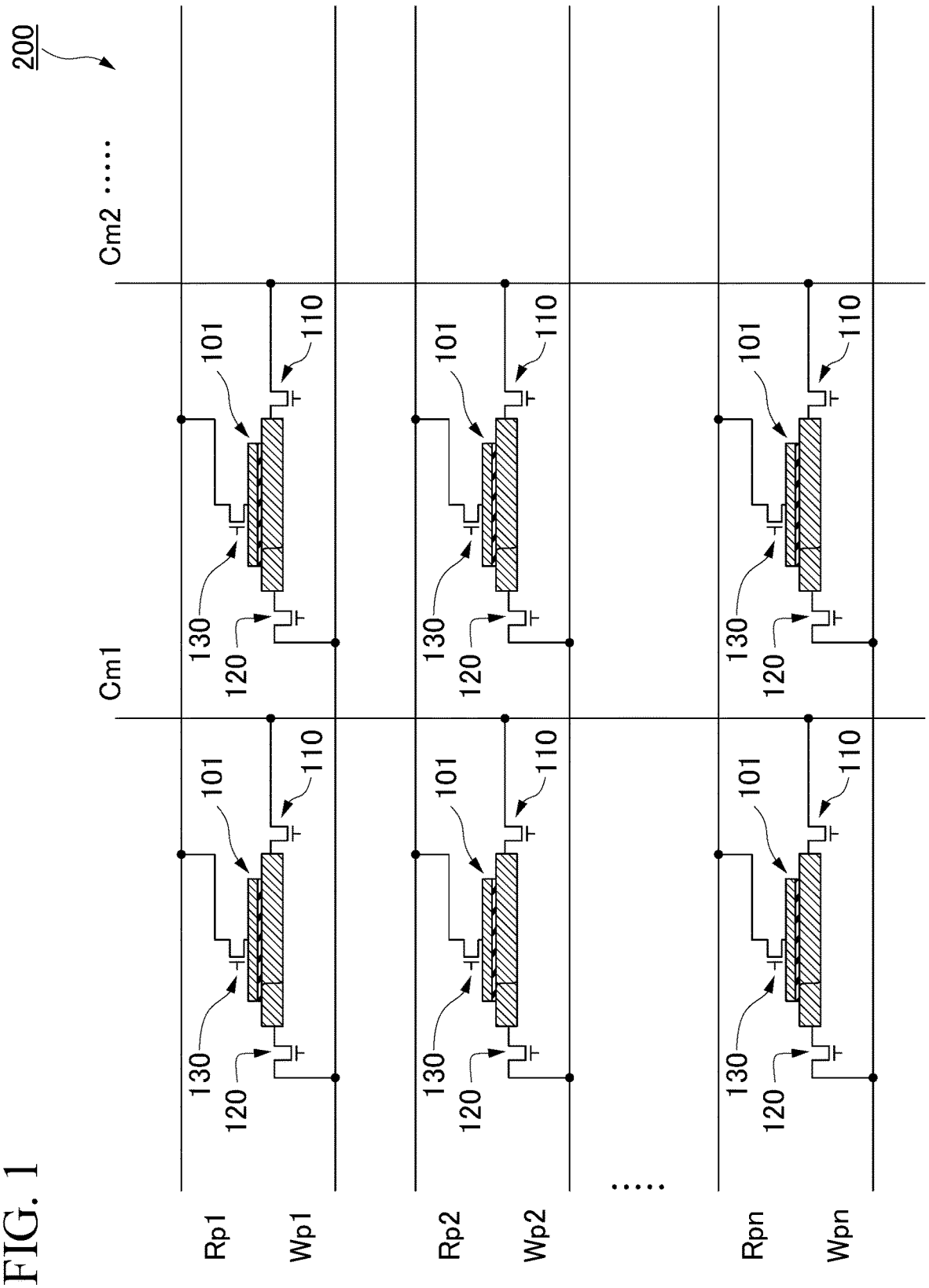
FIG. 1 is a configuration diagram of a magnetic recording array according to a first embodiment.

Hereinafter, the present embodiment will be described in detail with reference to the drawings as appropriate. In the drawings used in the following description, there are cases in which characteristic portions are appropriately enlarged for convenience of illustration so that characteristics of the present invention can be easily understood, and dimensional proportions or the like of respective constituent elements may be different from actual ones. Materials, dimensions, and the like illustrated in the following description are merely examples, and the present invention is not limited thereto and can be implemented with appropriate modifications within a range in which the effects of the present invention are achieved.

First, directions will be defined. A +x direction, a −x direction, a +y direction, and a −y direction are directions substantially parallel to one surface of a substrate Sub (see FIG. 2) to be described below. The +x direction is a direction in which a magnetic recording layer 20 to be described below extends and is a direction from a first conductive part 40 toward a second conductive part 50 to be described below. The −x direction is a direction opposite to the +x direction. When the +x direction and the −x direction do not need to be distinguished from each other, the directions will be simply referred to as an "x direction." The x direction is an example of a second direction. The +y direction is one direction perpendicular to the x direction. The −y direction is a direction opposite to the +y direction. When the +y direction and the −y direction do not need to be distinguished from each other, the directions will be simply referred to as a "y direction." A +z direction is a direction from the substrate Sub to be described below toward a magnetic domain wall displacement element 101. A −z direction is a direction opposite to the z direction. When the +z direction and the −z direction do not need to be distinguished from each other, the directions will be simply referred to as a "z direction." The z direction is an example of a first direction. In this specification, "extending in the x direction" means that, for example, a dimension in the x direction is longer than a minimum dimension among dimensions in the x direction, the y direction, and the z direction. The same applies to cases of extending in other directions.

First Embodiment

FIG. 1 is a configuration diagram of a magnetic recording array according to a first embodiment. A magnetic recording array 200 includes a plurality of magnetic domain wall displacement elements 101, a plurality of first interconnections Cm1 to Cmn, a plurality of second interconnections Wp1 to Wpn, a plurality of third interconnections Rp1 to Rpn, a plurality of first switching elements 110, a plurality of second switching elements 120, and a plurality of third switching elements 130. The magnetic recording array 200 can be used for, for example, a magnetic memory, a product-sum calculator, and a neuromorphic device.

<First Interconnection, Second Interconnection, and Third Interconnection>

The first interconnections Cm1 to Cmn are common interconnections. The common interconnections are interconnections that can be used at, for example, both the time of writing and reading data. Each of the first interconnections Cm1 to Cmn electrically connects a reference potential and one or more magnetic domain wall displacement elements 101. The reference potential may be, for example, the ground. The first interconnections Cm1 to Cmn may be connected to each of the plurality of magnetic domain wall displacement elements 101 or may be connected across the plurality of magnetic domain wall displacement elements 101.

The second interconnections Wp1 to Wpn are write interconnections. The write interconnections are, for example, interconnections used at the time of writing data. Each of the second interconnections Wp1 to Wpn electrically connects a power supply and one or more magnetic domain wall displacement elements 101. The third interconnections Rp1 to Rpn are read interconnections. The read interconnections are, for example, interconnections used at the time of reading data. Each of the third interconnections Rp1 to Rpn electrically connects the power supply and one or more magnetic domain wall displacement elements 101. The power supply is connected to one end of the magnetic recording array 200 at the time of use.

<First Switching Element, Second Switching Element, and Third Switching Element>

The first switching element 110, the second switching element 120, and the third switching element 130 illustrated in FIG. 1 are connected to each of the plurality of magnetic domain wall displacement elements 101. A device in which switching elements are connected to the magnetic domain wall displacement element 101 is referred to as a semiconductor device. The first switching elements 110 are connected between the magnetic domain wall displacement elements 101 and the first interconnections Cm1 to Cmn, respectively. The second switching elements 120 are connected between the magnetic domain wall displacement elements 101 and the second interconnections Wp1 to Wpn, respectively. The third switching elements 130 are connected between the magnetic domain wall displacement elements 101 and the third interconnections Rp1 to Rpn, respectively.

When the first switching element 110 and the second switching element 120 are turned on, a write current flows between the first interconnections Cm1 to Cmn and the second interconnections Wp1 to Wpn which are connected to a predetermined magnetic domain wall displacement element 101. When the first switching element 110 and the third switching element 130 are turned on, a read current flows between the first interconnections Cm1 to Cmn and the third interconnections Rp1 to Rpn which are connected to the predetermined magnetic domain wall displacement element 101.

The first switching element 110, the second switching element 120, and the third switching element 130 are elements that control a flow of a current. The first switching element 110, the second switching element 120, and the third switching element 130 may be, for example, transistors, elements utilizing a change in phase of a crystal layer such as ovonic threshold switches (OTS), elements utilizing a change in band structure such as metal-insulator transition (MIT) switches, elements utilizing a breakdown voltage such as Zener diodes and avalanche diodes, or elements whose conductivities change in accordance with change in atomic positions.

Any one of the first switching element 110, the second switching element 120, and the third switching element 130 may be shared by the magnetic domain wall displacement elements 101 connected to the same interconnection. For example, when the first switching element 110 is shared, a single first switching element 110 is disposed upstream of the first interconnections Cm1 to Cmn. For example, when the second switching element 120 is shared, a single second switching element 120 is disposed upstream of the second interconnections Wp1 to Wpn. For example, when the third switching element 130 is shared, a single third switching element 130 is disposed upstream of the third interconnections Rp1 to Rpn.

Figure 2:
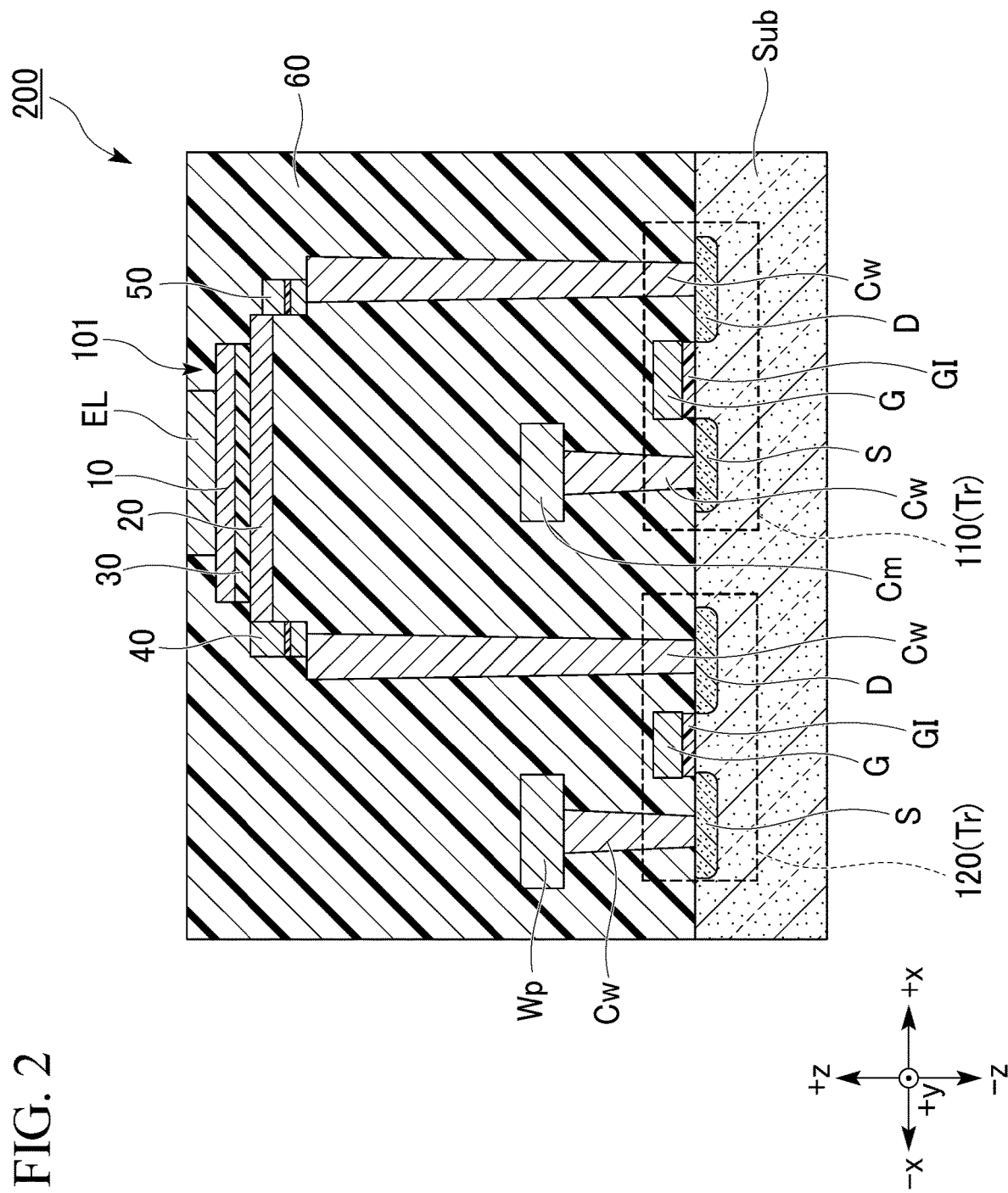
FIG. 2 is a cross-sectional view of a characteristic part of the magnetic recording array according to the first embodiment.

FIG. 2 is a cross-sectional view of a characteristic part of the magnetic recording array 200 according to the first embodiment. FIG. 2 is a cross section of one of the magnetic domain wall displacement elements 101 in FIG. 1 taken along an xz plane passing through a center of a width in the y direction of the magnetic recording layer 20. FIG. 2 focuses on one magnetic domain wall displacement element 101 and illustrates the first switching element 110 and the second switching element 120 connected to the magnetic domain wall displacement element 101. The third switching element 130 is connected to an electrode EL and is positioned, for example, in a depth direction (-y direction) as viewed in FIG. 2. The electrode EL is a conductor connected to a first ferromagnetic layer 10 of the magnetic domain wall displacement element 101 and is an electrode for causing a read current to flow to the magnetic domain wall displacement element 101. The magnetic domain wall displacement element 101 illustrated in FIG. 2 has a top pin structure in which the first ferromagnetic layer 10 to be described below is positioned at a position further away from the substrate Sub than the magnetic recording layer 20.

The first switching element 110 and the second switching element 120 illustrated in FIG. 2 are transistors Tr. The transistor Tr includes a gate electrode G, a gate insulating layer GI, and a source region S and a drain region D formed on the substrate Sub. The substrate Sub may be, for example, a semiconductor substrate.

Each of the transistors Tr is electrically connected to the magnetic domain wall displacement element 101 via a connection interconnection Cw. The connection interconnection Cw also connects the first interconnection Cm and the second interconnection Wp to the transistor Tr. The connection interconnection Cw contains a material having conductivity. The connection interconnection Cw extends in the z direction. The connection interconnection Cw is a via interconnection formed in an opening part of an insulating layer 60.

The magnetic domain wall displacement element 101 and the transistor Tr are electrically separated by the insulating layer 60 except for the connection interconnection Cw. The insulating layer 60 is an insulating layer that insulates between interconnections of multilayer interconnections and between elements. The insulating layer 60 may be formed of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide. ($ZrO_x$) or the like.

Figure 3:
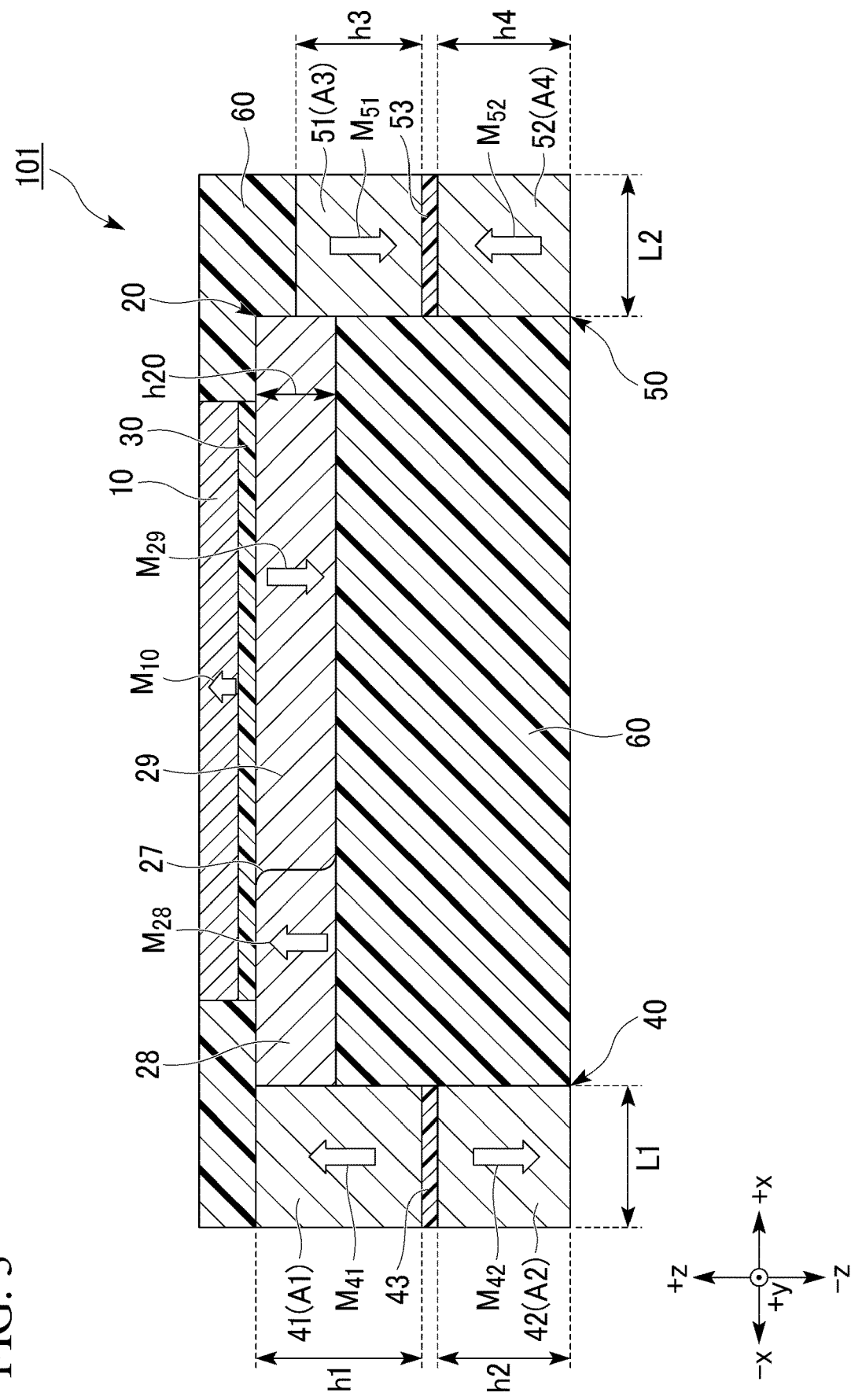
FIG. 3 is a cross-sectional view of a magnetic domain wall displacement element according to the first embodiment.
Figure 4:
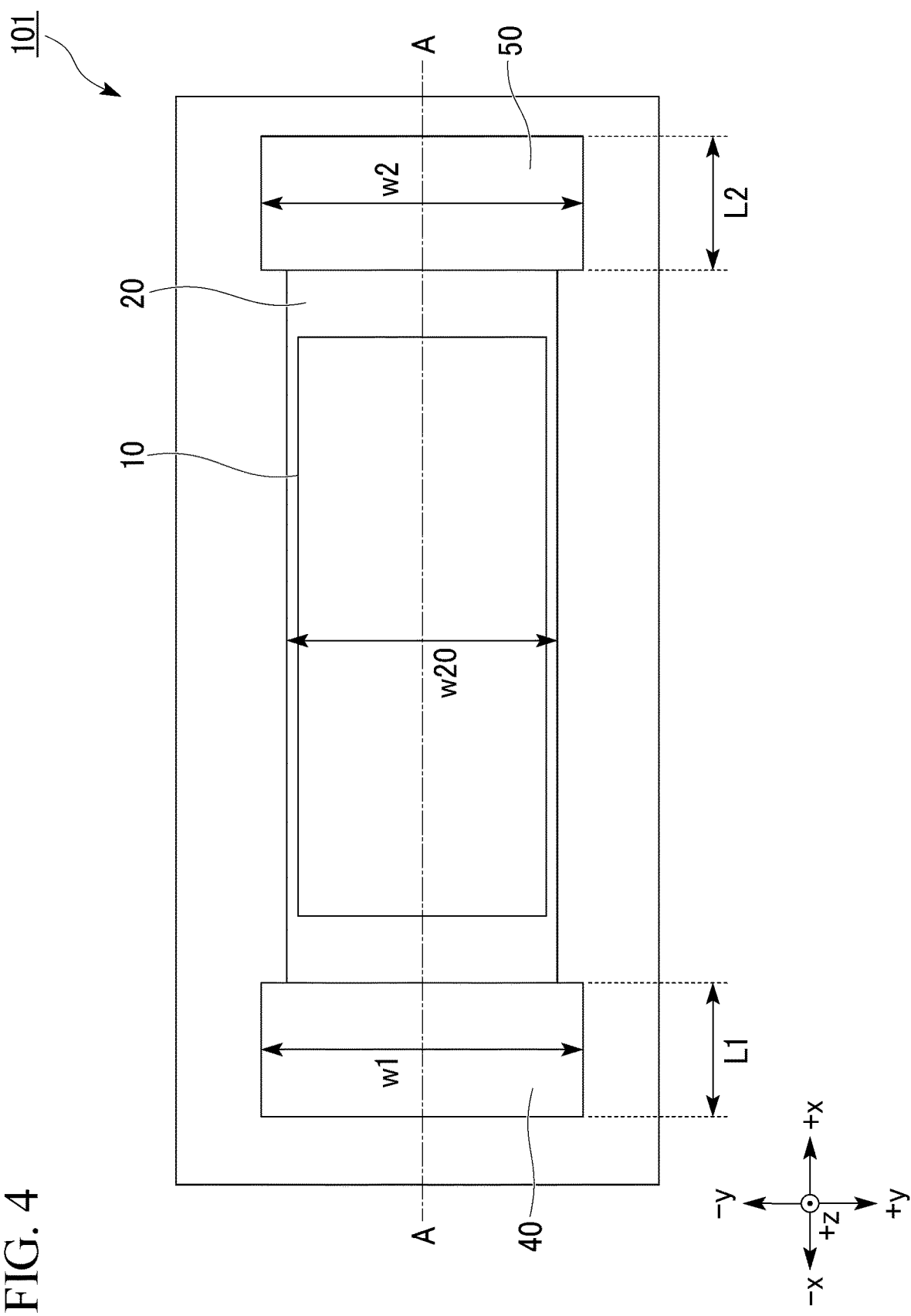
FIG. 4 is a plan view of the magnetic domain wall displacement element according to the first embodiment.

"Magnetic domain wall displacement element" FIG. 3 is a cross-sectional view of the magnetic domain wall displacement element 101 according to the first embodiment. FIG. 4 is a plan view of the magnetic domain wall displacement element 101 according to the first embodiment. The magnetic domain wall displacement element 101 includes the first ferromagnetic layer 10, the magnetic recording layer 20, a nonmagnetic layer 30, the first conductive part 40, and the second conductive part 50. FIG. 3 is a cross-sectional view of the magnetic domain wall displacement element 101 taken along an xz plane (plane A-A in FIG. 4) passing through a center of the magnetic recording layer 20 in the y direction. The magnetic domain wall displacement element 101 is used as a storage element as an example.

"First Ferromagnetic Layer"

The first ferromagnetic layer 10 faces the nonmagnetic layer 30. The first ferromagnetic layer 10 has a magnetization $M_{10}$ oriented in one direction. An orientation direction of the magnetization $M_{10}$ of the first ferromagnetic layer 10 is less likely to change than a magnetization of the magnetic recording layer 20 when a predetermined external force is applied. The predetermined external force may be, for example, an external force applied to the magnetization by an external magnetic field or an external force applied to the magnetization by a spin-polarized current. The first ferromagnetic layer 10 may be referred to as a magnetization fixed layer or a magnetization reference layer in some cases. The magnetization $M_{10}$ is oriented, for example, in the z direction.

Hereinafter, an example in which a magnetization is oriented in the z-axis direction will be described, but magnetizations of the magnetic recording layer 20 and the first ferromagnetic layer 10 may be oriented in any direction in an xy plane. When a magnetization is oriented in the z direction, power consumption and heat generation during operation of the magnetic domain wall displacement element 101 are suppressed compared to those when a magnetization is oriented in the xy plane. When a pulse current of the same intensity is applied a displacement width of a magnetic domain wall 27 when a magnetization is oriented in the z-direction becomes smaller than that when a magnetization is oriented in the xy plane. On the other hand, when a magnetization is oriented in any one direction in the xy plane, a magnetoresistance change width (MR ratio) of the magnetic domain wall displacement element 101 becomes larger than that when a magnetization is oriented in the z direction.

The first ferromagnetic layer 10 contains a ferromagnetic material. As the ferromagnetic material constituting the first ferromagnetic layer 10, for example, a metal selected from the group consisting of Cr, Mn, Co, Fe and Ni, an alloy containing one or more of these metals, and an alloy containing these metals and at least one of the elements B, C, and N, or the like can be used. The first ferromagnetic layer 10 may be, for example, Co—Fe, Co—Fe—B, or Ni—Fe.

A material constituting the first ferromagnetic layer 10 may be a Heusler alloy. A Heusler alloy is a half metal and has a high spin polarization. A Heusler alloy is an intermetallic compound having a chemical composition of XYZ or $X_2YZ$, in which X indicates a transition metal element or a noble metal element from the Co, Fe, Ni, or Cu groups in the Periodic Table, Y indicates a transition metal from the Mn, V, Cr, or Ti groups, or an element from the groups for X, and Z indicates a typical element from Group III to Group V. As the Heusler alloy, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like can be exemplified.

When an axis of easy magnetization of the first ferromagnetic layer 10 is oriented in the z direction (formed as a perpendicular magnetization film), a film thickness of the first ferromagnetic layer 10 is preferably 1.5 nm or less, and more preferably 1.0 nm or less. When the film thickness of the first ferromagnetic layer 10 is made thin, perpendicular magnetic anisotropy (interface perpendicular magnetic anisotropy) is induced to the first ferromagnetic layer 10 at an interface between the first ferromagnetic layer 10 and another layer (the nonmagnetic layer 30), and thus a magnetization of the first ferromagnetic layer 10 tends to be oriented in the z direction.

When an axis of easy magnetization of the first ferromagnetic layer 10 is oriented in the z direction (formed as a perpendicular magnetization film), it is preferable that the first ferromagnetic layer 10 be formed as a laminate of a ferromagnetic material selected from the group consisting of Co, Fe, and Ni and a nonmagnetic material selected from the group consisting of Pt, Pd, Ru, and Rh, and it is more preferable to insert an intermediate layer selected from the group consisting of Ir and Ru into any position of the laminate. When the ferromagnetic material and the nonmagnetic material are laminated, perpendicular magnetic anisotropy can be induced, and the magnetization of the first ferromagnetic layer 10 is easily oriented in the z direction by inserting the intermediate layer.

"Magnetic Recording Layer"

The magnetic recording layer 20 extends in the x direction. The magnetic recording layer 20 is an example of a second ferromagnetic layer. The magnetic recording layer 20 may be, for example, a rectangle having a long axis in the x direction and a short axis in the y direction in a plan view from the z direction. The magnetic recording layer 20 is a magnetic layer that faces the first ferromagnetic layer 10 with the nonmagnetic layer 30 sandwiched therebetween. The magnetic recording layer 20 connects between the first conductive part 40 and the second conductive part 50.

The magnetic recording layer 20 is a layer whose internal magnetic state changes, and the magnetic domain wall displacement element 101 can record information by change of the magnetization state of the magnetic recording layer 20. The magnetic recording layer 20 includes a first magnetic domain 28 and a second magnetic domain 29 therein. A magnetization $M_{28}$ of the first magnetic domain 28 and a magnetization $M_{29}$ of the second magnetic domain 29 may be oriented, for example, in opposite directions. A boundary between the first magnetic domain 28 and the second magnetic domain 29 is the magnetic domain wall 27. The magnetic recording layer 20 can have the magnetic domain wall 27 therein. In the magnetic recording layer 20 illustrated in FIG. 3, the magnetization $M_{28}$ of the first magnetic domain 28 is oriented in the +z direction, and the magnetization $M_{29}$ of the second magnetic domain 29 is oriented in the −z direction.

The magnetic domain wall displacement element 101 can record data in multiple values or continuously according to a position of the magnetic domain wall 27 of the magnetic recording layer 20. Data recorded in the magnetic recording layer 20 is read as a change in resistance value of the magnetic domain wall displacement element 101 when a read current is applied.

Proportions of the first magnetic domain 28 and the second magnetic domain 29 in the magnetic recording layer 20 changes when the magnetic domain wall 27 is displaced. The magnetization $M_{10}$ of the first ferromagnetic layer 10 may be oriented, for example, in the same direction (parallel) as the magnetization $M_{28}$ of the first magnetic domain 28, and in an opposite direction (antiparallel) to the magnetization $M_{29}$ of the second magnetic domain 29. When the magnetic domain wall 27 is displaced in the +x direction and an area of the first magnetic domain 28 in a portion overlapping the first ferromagnetic layer 10 in a plan view from the z direction increases, a resistance value of the magnetic domain wall displacement element 101 decreases. In contrast, when the magnetic domain wall 27 is displaced in the −x direction and an area of the second magnetic domain 29 in a portion overlapping the first ferromagnetic layer 10 in a plan view from the z direction increases, the resistance value of the magnetic domain wall displacement element 101 increases.

The magnetic domain wall 27 is displaced when a write current is caused to flow in the x direction of the magnetic recording layer 20 or an external magnetic field is applied. For example, when a write current (for example, a current pulse) is applied to the magnetic recording layer 20 in the +x direction, electrons flow in the −x direction that is opposite to a direction of the current and the magnetic domain wall 27 is displaced in the −x direction. When a current flows from the first magnetic domain 28 toward the second magnetic domain 29, electrons spin-polarized in the second magnetic domain 29 cause the magnetization $M_{28}$ of the first magnetic domain 28 to be subjected to magnetization reversal. When the magnetization $M_{28}$ of the first magnetic domain 28 is subjected to magnetization reversal, the magnetic domain wall 27 is displaced in the −x direction.

The magnetic recording layer 20 includes a magnetic material. As the magnetic material constituting the magnetic recording layer 20, a metal selected from the group consisting of Cr, Mn, Co, Fe, and Ni, an alloy containing one or more of these metals, an alloy containing these metals and at least one of the elements B, C, and N, or the like can be used. Specifically, Co—Fe, Co—Fe—B, and Ni—Fe can be exemplified.

The magnetic recording layer 20 preferably contains at least one element selected from the group consisting of Co, Ni, Pt, Pd, Gd, Tb, Mn, Ge, and Ga. The magnetic recording layer 20 may be, for example, a film in which Co and Ni are laminated, a film in which Co and Pt are laminated, or a film in which Co and Pd are laminated. The magnetic recording layer 20 may include, for example, an MnGa-based material, a GdCo-based material, or a TbCo-based material. Ferrimagnetic materials such as an MnGa-based material, a GdCo-based material, and a TbCo-based material have a small saturation magnetization, and thus a threshold current required to displace the magnetic domain wall decreases in the magnetic recording layer 20 containing these materials. Also, a film in which Co and Ni are laminated, a film in which Co and Pt are laminated, and a film in which Co and Pd are laminated have a large coercive force, and thus a displacement speed of the magnetic domain wall is slow in the magnetic recording layer 20 including these laminated films. Also, the magnetic recording layer 20 may have a configuration (a synthetic ferrimagnetic configuration) in which a plurality of ferromagnetic layers are antiferromagnetically coupled with an intermediate layer sandwiched therebetween. The intermediate layer may be, for example, Ru, and the plurality of ferromagnetic layers may be, for example, a film in which CoFe and Pd are laminated.

"Nonmagnetic Layer"

The nonmagnetic layer 30 is positioned between the first ferromagnetic layer 10 and the magnetic recording layer 20. The nonmagnetic layer 30 is laminated on one surface of the magnetic recording layer 20.

The nonmagnetic layer 30 may be formed of, for example, a nonmagnetic insulator, a nonmagnetic semiconductor, or a nonmagnetic metal. The nonmagnetic insulator may be, for example, a material such as $Al_2O_3$, $SiO_2$, MgO, $MgAl_2O_4$, or a material in which part of Al, Si, and Mg of the material described above is substituted with Zn, Be, or the like. These materials have a large band gap and are excellent in insulating properties. When the nonmagnetic layer 30 is formed of a nonmagnetic insulator, the nonmagnetic layer 30 is a tunnel barrier layer. The nonmagnetic metal may be, for example, Cu, Au, Ag, or the like. The nonmagnetic semiconductor may be, for example, Si, Ge, $CuInSe_2$, $CuGaSe_2$, $Cu(In, Ga)Se_2$, or the like.

A thickness of the nonmagnetic layer 30 is preferably 20 Å or more and more preferably 30 Å or more. When the thickness of the nonmagnetic layer 30 is large, a resistance area product (RA) of the magnetic domain wall displacement element 101 increases. The resistance area product (RA) of the magnetic domain wall displacement element 101 is preferably $1 \times 10^5$ $\Omega\mu m^2$ or more, and more preferably $1 \times 10^6$ $\Omega\mu m^2$ or more. The resistance area product (RA) of the magnetic domain wall displacement element 101 is represented by a product of an element resistance of one magnetic domain wall displacement element 101 and an element cross-sectional area of the magnetic domain wall displacement element 101 (an area of a cross section of the nonmagnetic layer 30 taken along an xy plane).

"First Conductive Part and Second Conductive Part"

The first conductive part 40 and the second conductive part 50 sandwich at least part of the magnetic recording layer 20 in the x direction in a plane view from the z direction. The first conductive part 40 and the second conductive part 50 are separated from each other and connected to the magnetic recording layer 20. The first conductive part 40 and the second conductive part 50 are respectively connected to, for example, the connection interconnection Cw (see FIG. 2). Each of the first conductive part 40 and the second conductive part 50 may be, for example, part of the connection interconnection Cw. The first conductive part 40 is connected to, for example, a first end portion of the magnetic recording layer 20, and the second conductive part 50 is connected to, for example, a second end portion of the magnetic recording layer 20.

Shapes of the first conductive part 40 and the second conductive part 50 in a plan view from the z direction are not particularly limited. For example, the first conductive part 40 and the second conductive part 50 illustrated in FIG. 4 are rectangular in a plan view from the z direction. The first conductive part 40 and the second conductive part 50 may be circular or elliptical. Widths w1 and w2 of the first conductive part 40 and the second conductive part 50 in the y direction may be wider than, for example, a width w20 of the magnetic recording layer 20 in the y direction.

The first conductive part 40 includes a first magnetic layer 41, a second magnetic layer 42, and a first intermediate layer 43. The first conductive part 40 includes the first magnetic layer 41, the first intermediate layer 43, and the second magnetic layer 42 in order from a side closer to the magnetic recording layer 20. The first magnetic layer 41 is in contact with the magnetic recording layer 20.

The first magnetic layer 41 and the second magnetic layer 42 contain a ferromagnetic material. The first magnetic layer 41 and the second magnetic layer 42 contain the same material as a material applied to, for example, the first ferromagnetic layer 10 and the magnetic recording layer 20. The first magnetic layer 41 and the second magnetic layer 42 may be, for example, a single layer formed of a single material or a plurality of layers. FIG. 3 illustrates a case in which the first magnetic layer 41 and the second magnetic layer 42 are single layers. A magnetization $M_{41}$ of the first magnetic layer 41 and a magnetization $M_{42}$ of the second magnetic layer 42 are oriented in different directions. The magnetization $M_{41}$ of the first magnetic layer 41 is oriented, for example, in the +z direction, and the magnetization $M_{42}$ of the second magnetic layer 42 is oriented, for example, in the −z direction. The +z direction is an example of a first magnetization direction, and the −z direction is an example of a second magnetization direction.

The first intermediate layer 43 is a layer that magnetically couples the two ferromagnetic materials. The first intermediate layer 43 may be referred to as a magnetic coupling layer or an insertion layer in some cases. The first intermediate layer 43 is formed of a nonmagnetic material. The first intermediate layer 43 contains at least one selected from, for example, the group consisting of Ru, Ir, and Rh. A thickness of the first intermediate layer 43 may be, for example, 2 nm or less, and preferably 1 nm or less.

The first intermediate layer 43 is sandwiched between two magnetization regions (a first magnetization region A1 and a second magnetization region A2). In the magnetic domain wall displacement element 101 in FIG. 3, the first magnetization region A1 coincides with the first magnetic layer 41, and the second magnetization region A2 coincides with the second magnetic layer 42. The first magnetization region A1 and the second magnetization region A2 are antiferromagnetically coupled with, for example, the first intermediate layer 43 interposed therebetween.

The second conductive part 50 includes a third magnetic layer 51, a fourth magnetic layer 52, and a second intermediate layer 53. The second conductive part 50 includes the third magnetic layer 51, the second intermediate layer 53, and the fourth magnetic layer 52 in order from a side closer to the magnetic recording layer 20. The third magnetic layer 51 is in contact with the magnetic recording layer 20.

The third magnetic layer 51 and the fourth magnetic layer 52 contain a ferromagnetic material. The third magnetic layer 51 and the fourth magnetic layer 52 contain the same material as a material applied to, for example, the first ferromagnetic layer 10 and the magnetic recording layer 20. The third magnetic layer 51 and the fourth magnetic layer 52 may be, for example, a single layer formed of a single material or a plurality of layers. FIG. 3 illustrates a case in which the third magnetic layer 51 and the fourth magnetic layer 52 are single layers. The magnetization $M_{51}$ of the third magnetic layer 51 is oriented in a direction different from, for example, the magnetizations $M_{41}$ and $M_{52}$ of the first magnetic layer 41 and the fourth magnetic layer 52. The magnetization $M_{51}$ of the third magnetic layer 51 is oriented in the same direction as, for example, the magnetization $M_{42}$ of the second magnetic layer 42. The magnetization $M_{52}$ of the fourth magnetic layer 52 is oriented in a direction different from, for example, the magnetizations $M_{42}$ and $M_{51}$ of the second magnetic layer 42 and the third magnetic layer 51. The magnetization $M_{52}$ of the fourth magnetic layer 52 is oriented in the same direction as, for example, the magnetization $M_{41}$ of the first magnetic layer 41. The magnetization $M_{51}$ of the third magnetic layer 51 may be oriented, for example, in the −z direction, and the magnetization $M_{52}$ of the fourth magnetic layer 52 may be oriented, for example, in the +z direction.

The second intermediate layer 53 is a layer that magnetically couples the two ferromagnetic materials. The second intermediate layer 53 may be referred to as a magnetic coupling layer or an insertion layer in some cases. A material and a thickness constituting the second intermediate layer 53 are the same as those of the first intermediate layer 43. The second intermediate layer 53 is sandwiched between two magnetization regions (a third magnetization region A3 and a fourth magnetization region A4). In the magnetic domain wall displacement element 101 in FIG. 3, the third magnetization region A3 coincides with the third magnetic layer 51, and the fourth magnetization region A4 coincides with the fourth magnetic layer 52. The third magnetization region A3 and the fourth magnetization region A4 are antiferromagnetically coupled with, for example, the second intermediate layer 53 interposed therebetween.

A thickness h1 in the z direction of the first magnetization region A1 is thicker than a thickness h2 in the z direction of the second magnetization region A2. A length L1 in the x direction of the first conductive part 40 is substantially constant at each position in the z direction. The "substantially constant" means that an amount of variation from an average value is 10% or less. Therefore, a difference between the thicknesses h1 and h2 can be converted into a difference in area, and an area of the first magnetization region A1 is larger than an area of the second magnetization region A2. The width w1 in the y direction of the first conductive part 40 (see FIG. 4) is also substantially constant at each position in the x direction. Therefore, a difference between the thicknesses h1 and h2 can be converted into a difference in volume.

A thickness h3 in the z direction of the third magnetization region A3 is thinner than a thickness h4 in the z direction of the fourth magnetization region A4. A length L2 in the x direction and the width w2 in the y direction of the second conductive part 50 are substantially constant. A difference between the thicknesses h3 and h4 can be converted into differences in area and volume. An area of the third magnetization region A3 is smaller than an area of the fourth magnetization region A4.

The thickness h2 of the second magnetization region A2 and the thickness h4 of the fourth magnetization region A4 may be, for example, equal. Here, the "equal" is not limited to a case of complete coincidence, and an error of about 10% is allowed. That is, the thickness h2 of the second magnetization region A2 and the thickness h4 of the fourth magnetization region A4 may be, for example, equal. The area of the second magnetization region A2 and the area of the fourth magnetization region A4 may be, for example, equal (substantially coincide). The first intermediate layer 43 and the second intermediate layer 53 are laminated on the second magnetization region A2 and the fourth magnetization region A4. The first intermediate layer 43 and the second intermediate layer 53 may be, for example, at the same height position in the z direction. When the height positions of the first intermediate layer 43 and the second intermediate layer 53 in the z direction are aligned, the first intermediate layer 43 and the second intermediate layer 53 can be deposited at one time.

The thickness h1 of the first magnetization region A1 may be thicker than, for example, the thickness h3 of the third magnetization region A3. The area of the first magnetization region A1 is larger than, for example, the area of the third magnetization region A3.

The thicknesses h1 and h3 of the first magnetization region A1 and the third magnetization region A3 may be thicker than, for example, a thickness h20 of the magnetic recording layer 20. Also, the widths w1 and w2 in the y direction of the first magnetization region A1 and the third magnetization region A3 may be larger than, for example, the width w20 in the y direction of the magnetic recording layer 20. An area (h1×w1 or h3×w3) of a cross section of the first magnetization region A1 or the third magnetization region A3 taken along a yz plane may be larger than, for example, an area (h20×w20) of a cross section of the magnetic recording layer 20 taken along a yz plane. Since current densities in the first magnetization region A1 and the third magnetization region A3 are larger than a current density in the magnetic recording layer 20, an intrusion of the magnetic domain wall 27 into the first magnetization region A1 and the third magnetization region A3 can be further inhibited.

Magnetization directions of the first ferromagnetic layer 10, the magnetic recording layer 20, the first conductive part 40, and the second conductive part 50 of the magnetic domain wall displacement element 101 can be ascertained by, for example, measuring a magnetization curve. A magnetization curve can be measured using, for example, a magneto optical Kerr effect (MOKE). The measurement by MOKE is a measurement method that is performed using a magneto-optical effect (magnetic Kerr effect) in which rotation in a polarization direction or the like occurs when linearly polarized light is incident on an object to be measured.

A method of manufacturing the magnetic recording array 200 will be described. The magnetic recording array 200 is formed by a laminating step of each layer and a processing step of processing part of each layer into a predetermined shape. A sputtering method, a chemical vapor deposition (CVD) method, an electron beam evaporation method (EB evaporation method), an atomic laser deposition method, or the like can be used for lamination of each layer. Processing of each layer can be performed using photolithography, ion milling, or the like.

First, predetermined positions of the substrate Sub are doped with impurities to form the source region S and the drain region D. Next, the gate insulating layer GI and the gate electrode G are formed between the source region S and the drain region D. The source region S, the drain region D, the gate insulating layer GI, and the gate electrode G form the transistor Tr.

Next, the insulating layer 60 is formed to cover the transistor Tr. Also, an opening part is formed in the insulating layer 60, and a conductor is filled in the opening part to form the connection interconnection Cw. The first interconnection Cm, the second interconnection Wp, and the third interconnection Rp are formed by laminating the insulating layer 60 to a predetermined thickness, forming a groove on the insulating layer 60, and filling the groove with a conductor.

The layers constituting the first conductive part 40 and the second conductive part 50 may be laminated inside of an opening, which is formed in the insulating layer 60, in sequence. Also, after the layers constituting the first conductive part 40 and the second conductive part 50 are laminated, only portions to be the first conductive part 40 and the second conductive part 50 may be left by removing the other portions.

Figure 5:
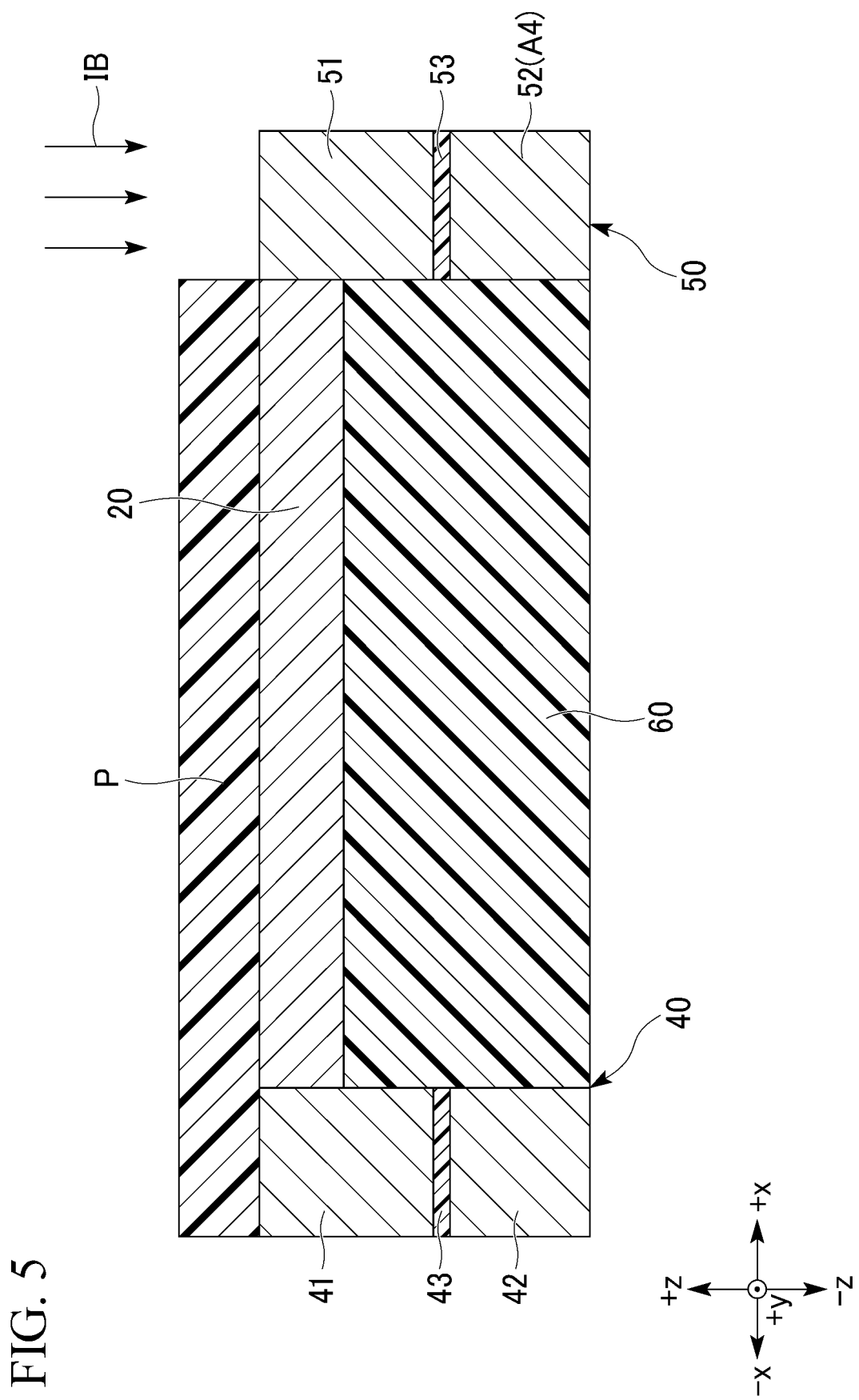
FIG. 5 is a cross-sectional view illustrating part of a first method of manufacturing the magnetic domain wall displacement element according to the first embodiment.

A difference between the thicknesses h1 and h3 of the first magnetic layer 41 and the third magnetic layer 51 may be generated by, for example, laminating the layers constituting the first conductive part 40 and the second conductive part 50 and then milling part of them. FIG. 5 is a cross-sectional view illustrating part of a first method of manufacturing the magnetic domain wall displacement element 101.

The first conductive part 40, the second conductive part 50, and the magnetic recording layer 20 are formed inside the insulating layer 60. The magnetic recording layer 20 may be deposited on one surface of the insulating layer 60, for example, using a sputtering method. Next, surfaces of the first conductive part 40 and the magnetic recording layer 20 are covered with a protective film P. The protective film P may be, for example, a resist. Then, the laminated film is irradiated with an ion beam IB. The first conductive part 40 and the magnetic recording layer 20 protected by the protective film P are not removed by the ion beam IB, but part of the third magnetic layer 51 of the second conductive part 50 is removed by the ion beam IB. As a result, the thickness h3 of the third magnetic layer 51 is made thinner than the thickness h1 of the first magnetic layer 41.

Finally, a nonmagnetic layer and a ferromagnetic layer are sequentially laminated at a position overlapping the magnetic recording layer 20 in the z direction and are processed into a predetermined shape to form the nonmagnetic layer 30 and the first ferromagnetic layer 10. With such a procedure, the magnetic domain wall displacement element 101 can be manufactured.

Figure 6:
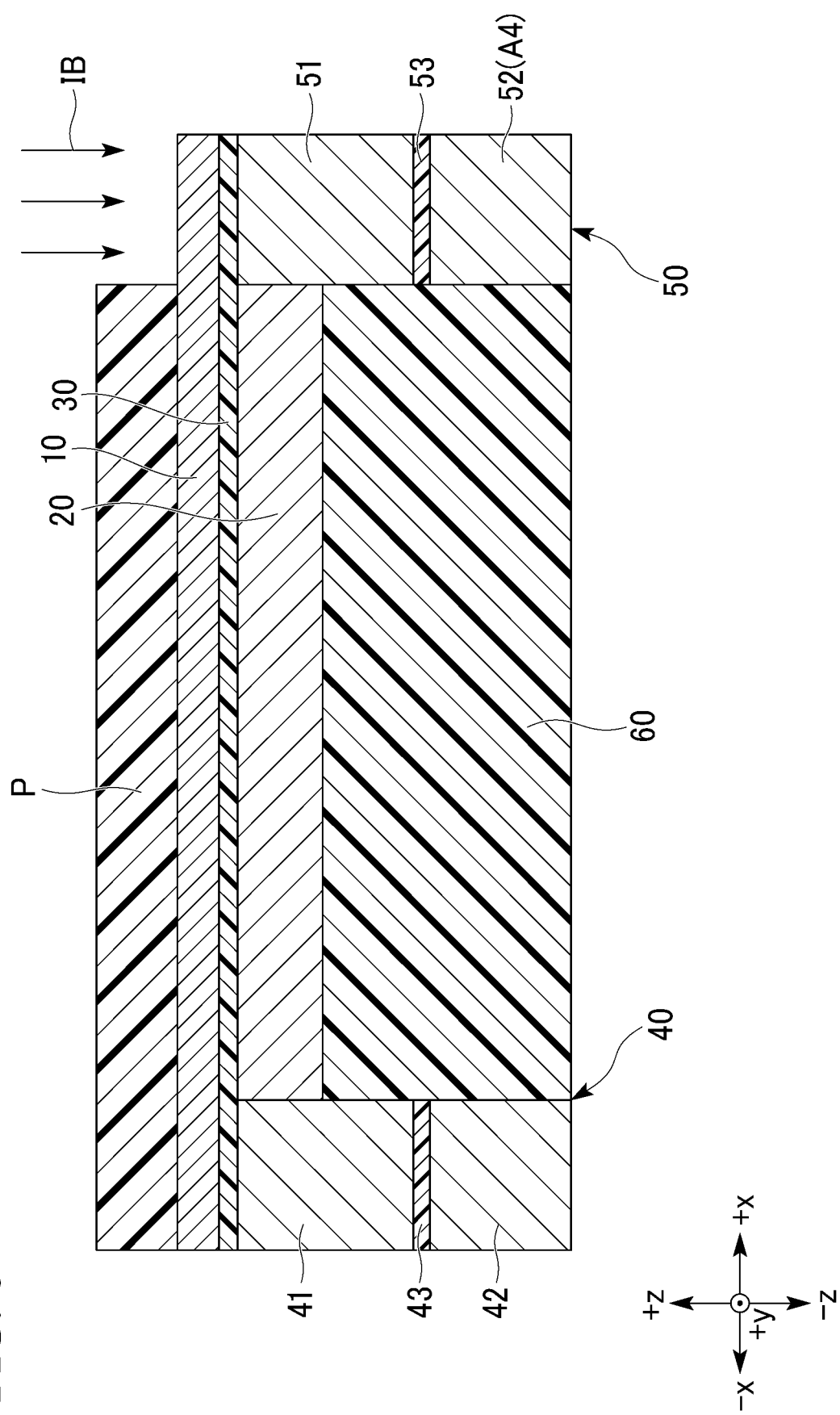
FIG. 6 is a cross-sectional view illustrating part of a second method of manufacturing the magnetic domain wall displacement element according to the first embodiment.

FIG. 6 is a cross-sectional view illustrating part of a second method of manufacturing the magnetic domain wall displacement element 101. As illustrated in FIG. 6, the nonmagnetic layer 30 and the first ferromagnetic layer 10 may be irradiated with the ion beam IB after they are laminated. The processing of the nonmagnetic layer 30 and the first ferromagnetic layer 10 and the processing of the third magnetic layer 51 can be performed at the same time.

In the magnetic domain wall displacement element 101 according to the first embodiment, an initial state can be easily defined by simply applying an external magnetic field in one direction. Here, the initial state includes both an initial state before shipment and an initial state after data refresh in the process of use. Defining an initial state before shipment is particularly useful for improving the yield.

For example, a large magnetic field is applied to the magnetic domain wall displacement element 101 in the +z direction. When a sufficiently large magnetic field is applied, all the magnetizations $M_{10}$, $M_{28}$, $M_{29}$, $M_{41}$, $M_{42}$, $M_{51}$, and $M_{52}$ constituting the magnetic domain wall displacement element 101 are oriented in the +z direction. When the application of the external magnetic field is stopped, the magnetizations $M_{41}$ and $M_{42}$ tend to be oriented in opposite directions. This is because the first magnetic layer 41 and the second magnetic layer 42 are antiferromagnetically coupled with the first intermediate layer 43 interposed therebetween. Similarly, the magnetizations $M_{51}$ and $M_{52}$ tend to be oriented in opposite directions. This is because the third magnetic layer 51 and the fourth magnetic layer 52 are antiferromagnetically coupled with the second intermediate layer 53 interposed therebetween.

The first magnetic layer 41 is thicker than the second magnetic layer 42, and the first magnetic layer 41 has a larger coercive force energy than the second magnetic layer 42. The coercive force energy is energy that is proportional to a product of a saturation magnetization and a thickness (area). The larger the coercive force energy, the more difficult it is to cause magnetization reversal. The magnetization $M_{41}$ of the first magnetic layer 41 being oriented in the +z direction is maintained, and the magnetization $M_{42}$ of the second magnetic layer 42 is oriented in the −z direction.

On the other hand, the third magnetic layer 51 is thinner than the fourth magnetic layer 52, and the third magnetic layer 51 has a smaller coercive force energy than the fourth magnetic layer 52. The magnetization $M_{52}$ of the fourth magnetic layer 52 being oriented in the +z direction is maintained, and the magnetization $M_{51}$ of the third magnetic layer 51 is oriented in the −z direction.

Orientation directions of the magnetizations $M_{41}$ and $M_{51}$ of the first magnetic layer 41 and the third magnetic layer 51 that are in contact with the magnetic recording layer 20 are different from each other. In order to eliminate the difference in the orientation directions, the magnetic domain wall 27 is formed inside the magnetic recording layer 20. That is, different magnetization states can be formed at both ends of the magnetic recording layer 20 to generate the magnetic domain wall 27 therein by simply applying an external magnetic field in one direction. Since the magnetic domain wall 27 is formed at an arbitrary position, an initial state can be easily defined.

Although an example of the magnetic domain wall displacement element 101 according to the first embodiment has been described in detail, the magnetic domain wall displacement element 101 according to the first embodiment can be variously modified and changed within the gist of the present invention.

First Modified Example

Figure 7:
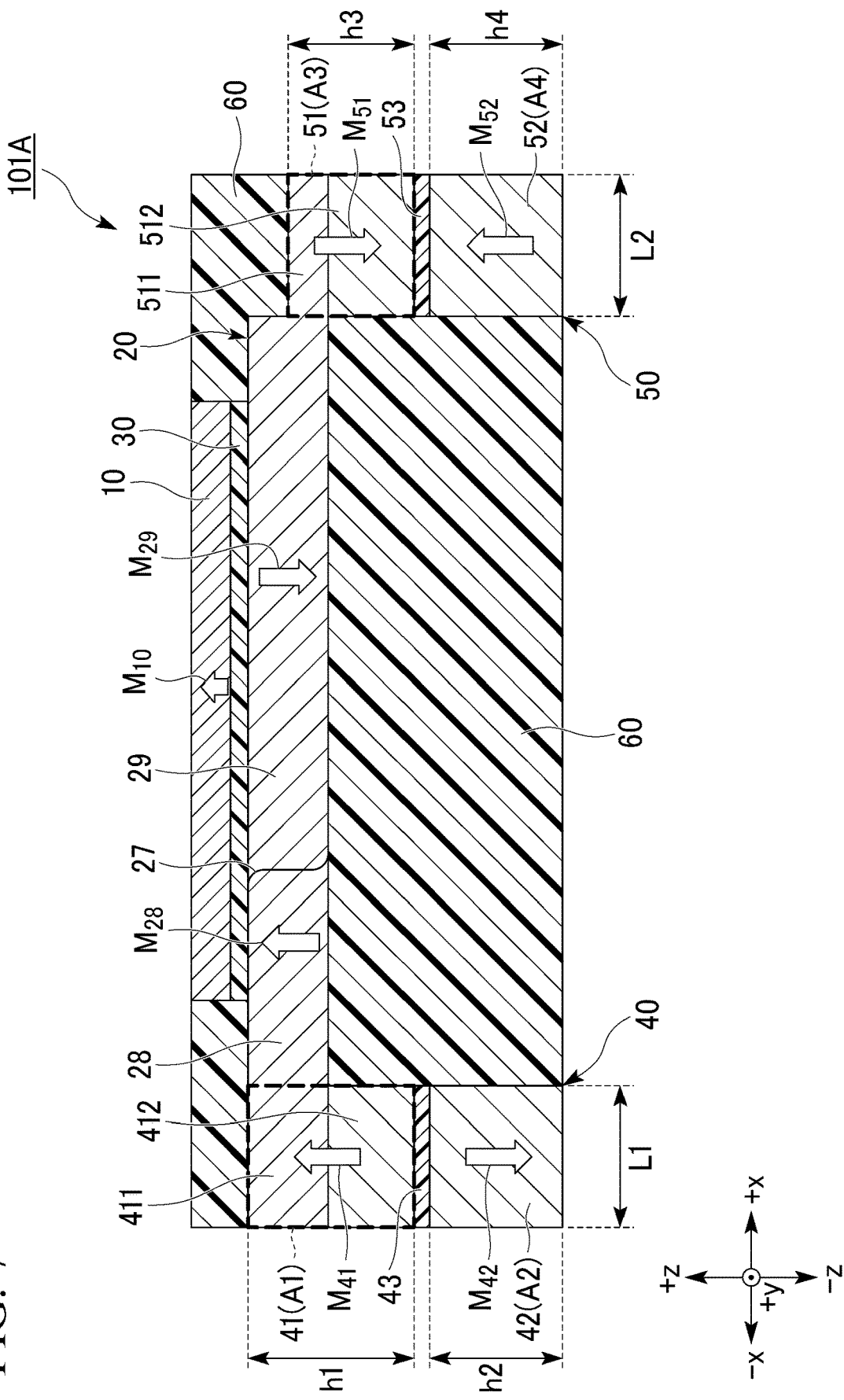
FIG. 7 is a cross-sectional view of a magnetic domain wall displacement element according to a first modified example.

FIG. 7 is a cross-sectional view of a magnetic domain wall displacement element 101A according to a first modified example. The magnetic domain wall displacement element 101A illustrated in FIG. 7 differs from the magnetic domain wall displacement element 101 illustrated in FIG. 3 in that a first magnetic layer 41 and a third magnetic layer 51 have a two-layer configuration. Other components are the same as those of the magnetic domain wall displacement element 101, and the same components will be denoted by the same references and description thereof will be omitted.

The first magnetic layer 41 includes a first layer 411 and a second layer 412. The first layer 411 is formed of the same material as that of the magnetic recording layer 20. There is no boundary between the first layer 411 and the magnetic recording layer 20, and a portion overlapping the first intermediate layer 43 in the z direction is the first layer 411. The second layer 412 is formed of a material different from that of the first layer 411. The first layer 411 and the second layer 412 are magnetically coupled to each other. A region in which the first layer 411 and the second layer 412 are combined is the first magnetization region A1.

The third magnetic layer 51 includes a first layer 511 and a second layer 512. The first layer 511 is formed of the same material as that of the magnetic recording layer 20. There is no boundary between the first layer 511 and the magnetic recording layer 20, and a portion overlapping the second intermediate layer 53 in the z direction is the first layer 511. The second layer 512 is formed of a material different from that of the first layer 511. The first layer 511 and the second layer 512 are magnetically coupled to each other. A region in which the first layer 511 and the second layer 512 are combined is the third magnetization region A3.

The magnetic domain wall displacement element 101A can be obtained by forming the second layers 412 and 512 and the insulating layer 60 and then depositing a magnetic layer thereon. Partial portions of the deposited magnetic layer are the first layers 411 and 511 and the magnetic recording layer 20.

Since the first magnetization region A1 has larger coercive force energy than the second magnetization region A2, and the third magnetization region A3 has smaller coercive force energy than the fourth magnetization region A4, the magnetic domain wall displacement element 101A according to the first modified example achieves the same effects as in the magnetic domain wall displacement element 101 according to the first embodiment.

Second Embodiment

Figure 8:
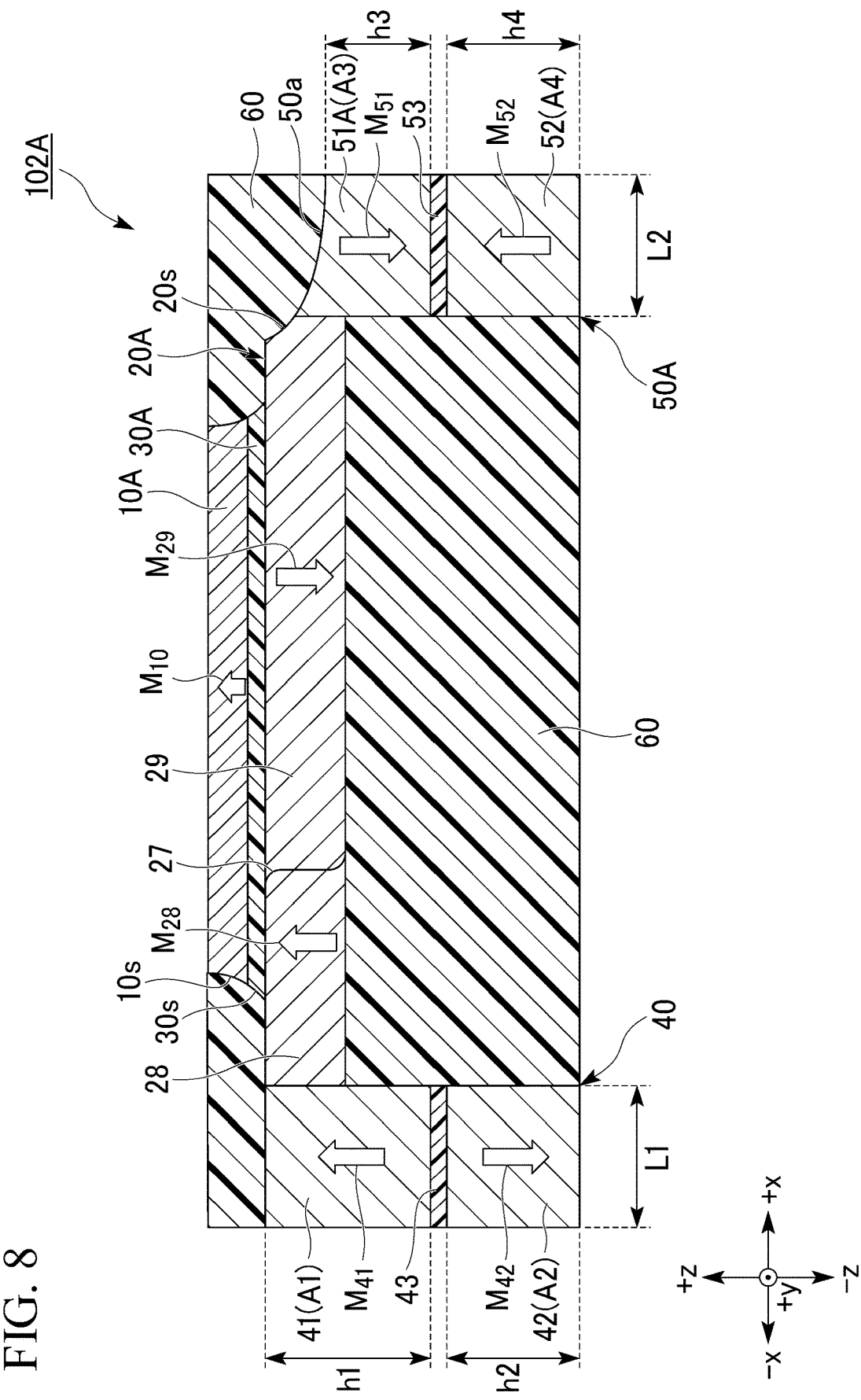
FIG. 8 is a cross-sectional view of a magnetic domain wall displacement element according to a second embodiment.
Figure 9:
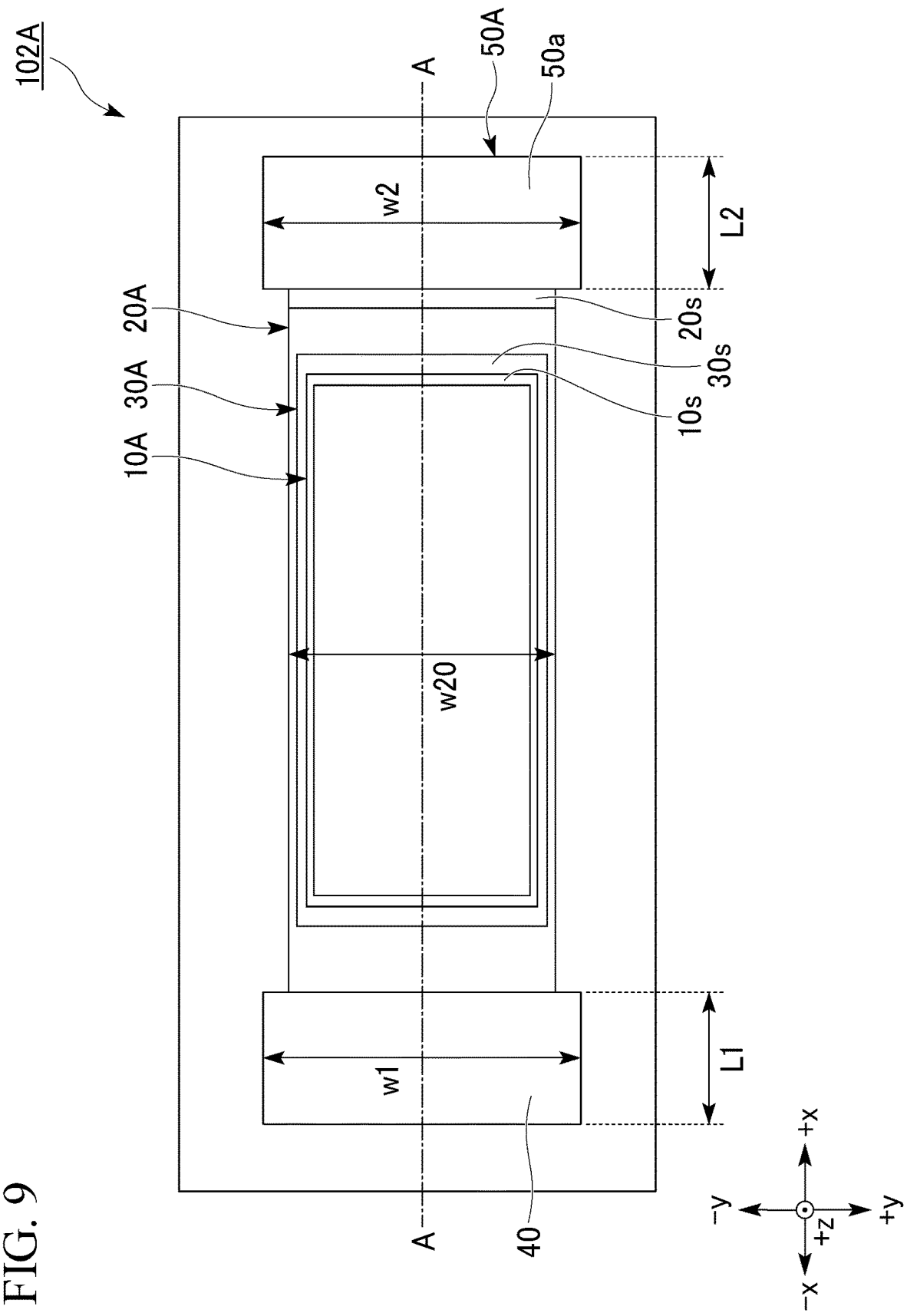
FIG. 9 is a plan view of the magnetic domain wall displacement element according to the second embodiment.

FIG. 8 is a cross-sectional view of a magnetic domain wall displacement element 102A according to a second embodiment. FIG. 8 is a cross-sectional view of the magnetic domain wall displacement element 102A taken along an xz plane (plane A-A in FIG. 9) passing through a center of a magnetic recording layer 20 in the y direction. FIG. 9 is a plan view of the magnetic domain wall displacement element 102A according to the second embodiment. The magnetic domain wall displacement element 102A is different from the magnetic domain wall displacement element 101 according to the first embodiment in shapes of a first ferromagnetic layer 10A, a nonmagnetic layer 30A, a magnetic recording layer 20A, and a second conductive part 50A. Other components are the same as those of the magnetic domain wall displacement element 101, and the same components will be denoted by the same references and description thereof will be omitted.

In the first ferromagnetic layer 10A and the nonmagnetic layer 30A, side surfaces 10s and 30s thereof in the x direction are inclined in the x direction with respect to an xy plane. Widths of the first ferromagnetic layer 10A and the nonmagnetic layer 30A in the x direction increases toward the magnetic recording layer 20A. In the first ferromagnetic layer 10A and the nonmagnetic layer 30A, side surfaces 10s and 30s thereof in the y direction are also inclined in the y direction with respect to the xy plane. The side surface 10s and the side surface 30s are continuous with each other. The "continuous" means that an inclination angle of a tangent thereof does not change in stages and includes a case in which the inclination angle of the tangent is constant and a case in which the inclination angle of the tangent changes continuously.

The magnetic recording layer 20A is different from the magnetic recording layer 20 according to the first embodiment in that the magnetic recording layer 20A has an inclined surface 20s at an end portion on the second conductive part 50A side. The inclined surface 20s is inclined in the x direction with respect to the xy plane. The inclined surface 20s is discontinuous with the side surfaces 10s and 30s. There is a step between the side surface 30s and the inclined surface 20s.

The second conductive part 50A is different from the second conductive part 50 according to the first embodiment in a shape of a third magnetic layer 51A. An area of the third magnetic layer 51A in FIG. 8 is smaller than an area of a fourth magnetic layer 52. Therefore, an area of a third magnetization region A3 is smaller than that of a fourth magnetization region A4. Also, the third magnetic layer 51A includes a portion having a smaller thickness than the fourth magnetic layer 52. In the third magnetic layer 51A, a first surface 50a is inclined in the x direction with respect to the xy plane. The first surface 50a is a surface of the third magnetic layer 51A on a side close to the first ferromagnetic layer 10A in the z direction and is positioned on a side opposite to a surface of the third magnetization region A3 in contact with a second intermediate layer 53 in the z direction. The first surface 50a is continuous with the inclined surface 20s.

The magnetic domain wall displacement element 102A is easily formed when the second conductive part 50A is separately processed from the first ferromagnetic layer 10A and the nonmagnetic layer 30A (when the manufacturing conditions illustrated in FIG. 5 are employed).

Since a first magnetization region A1 has a larger coercive force energy than a second magnetization region A2, and the third magnetization region A3 has a smaller coercive force energy than the fourth magnetization region A4, the magnetic domain wall displacement element 102A according to the second embodiment achieves the same effects as in the magnetic domain wall displacement element 101 according to the first embodiment. Also, a flow of a current from the second conductive part 50A to the magnetic recording layer 20A is made smooth by the first surface 50a and the inclined surface 20s, and thus energy loss can be suppressed.

Second Modified Example

Figure 10:
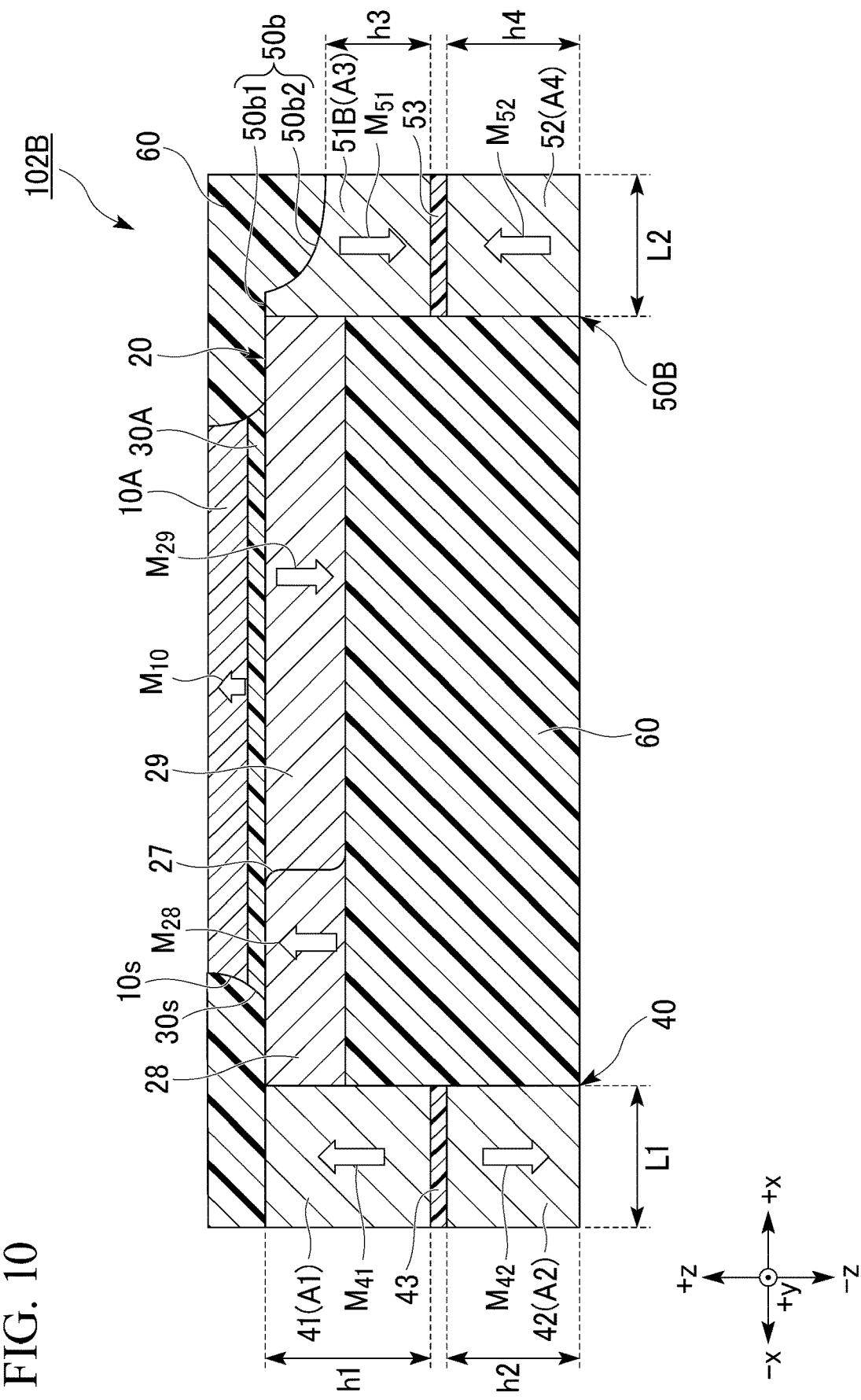
FIG. 10 is a cross-sectional view of a magnetic domain wall displacement element according to a second modified example.
Figure 11:
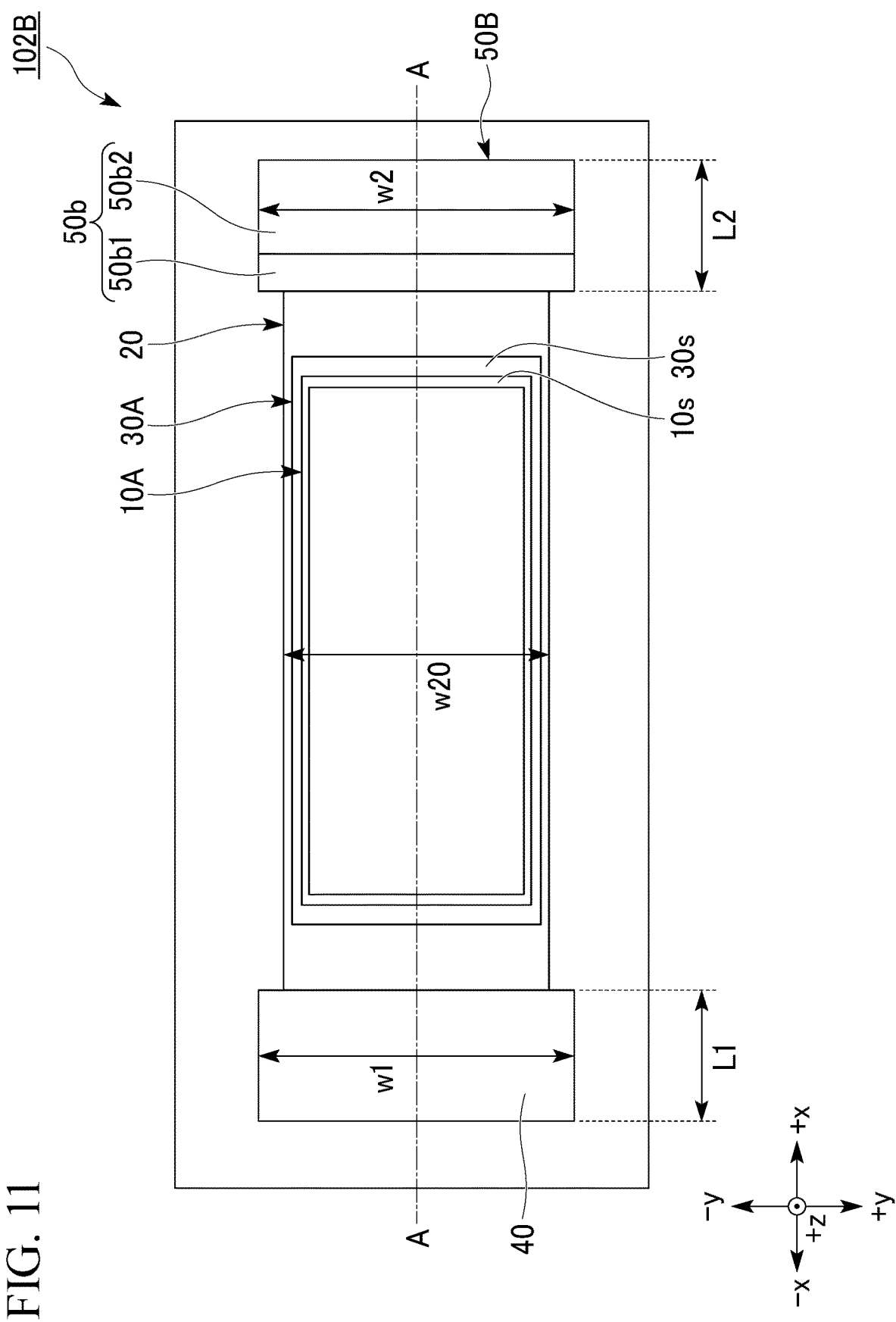
FIG. 11 is a plan view of the magnetic domain wall displacement element according to the second modified example.

FIG. 10 is a cross-sectional view of a magnetic domain wall displacement element 102B according to a second modified example. FIG. 11 is a plan view of the magnetic domain wall displacement element 102B according to the second modified example. The magnetic domain wall displacement element 102B differs from the magnetic domain wall displacement element 102A in shapes of the magnetic recording layer 20 and a second conductive part 50B. Components the same as those in the magnetic domain wall displacement element 102A will be denoted by the same references, and description thereof will be omitted.

The magnetic recording layer 20 is the same as the magnetic recording layer 20 according to the first embodiment.

The second conductive part 50B is different from the second conductive part 50 according to the first embodiment in a shape of a third magnetic layer 51B. An area of the third magnetic layer 51B in FIG. 10 is smaller than an area of the fourth magnetic layer 52. Therefore, an area of the third magnetization region A3 is smaller than that of the fourth magnetization region A4. Also, the third magnetic layer 51B includes a portion having a smaller thickness than the fourth magnetic layer 52. In the third magnetic layer 51B, a first surface 50b includes a flat surface 50b1 and an inclined surface 50b2. The flat surface 50b1 is parallel to the xy plane. The inclined surface 50b2 is inclined in the x direction with respect to the xy plane.

The magnetic domain wall displacement element 102B is easily formed when the second conductive part 50B is separately processed from the first ferromagnetic layer 10A and the nonmagnetic layer 30A (when the manufacturing conditions illustrated in FIG. 5 are employed).

The magnetic domain wall displacement element 102B according to the second modified example achieves the same effects as in the magnetic domain wall displacement element 102A. Since the inclined surface 20s is not formed in the magnetic recording layer 20, a variation of a current density in the magnetic recording layer 20 can be made small. A displacement condition of the magnetic domain wall 27 changes according to a variation in the current density. When a variation of the current density in the magnetic recording layer 20 is small, an operation of the magnetic domain wall 27 is stabilized.

Third Modified Example

Figure 12:
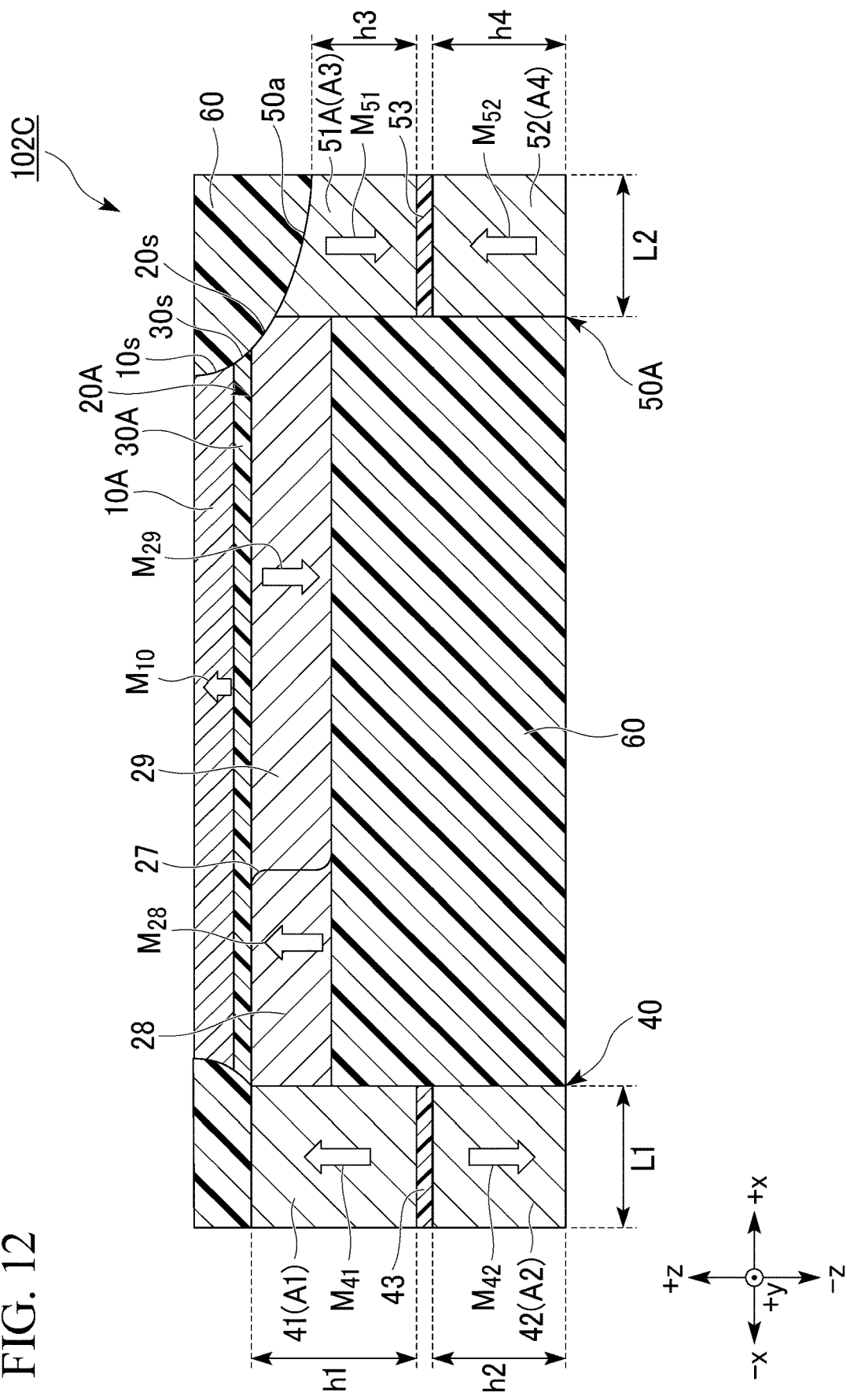
FIG. 12 is a cross-sectional view of a magnetic domain wall displacement element according to a third modified example.
Figure 13:
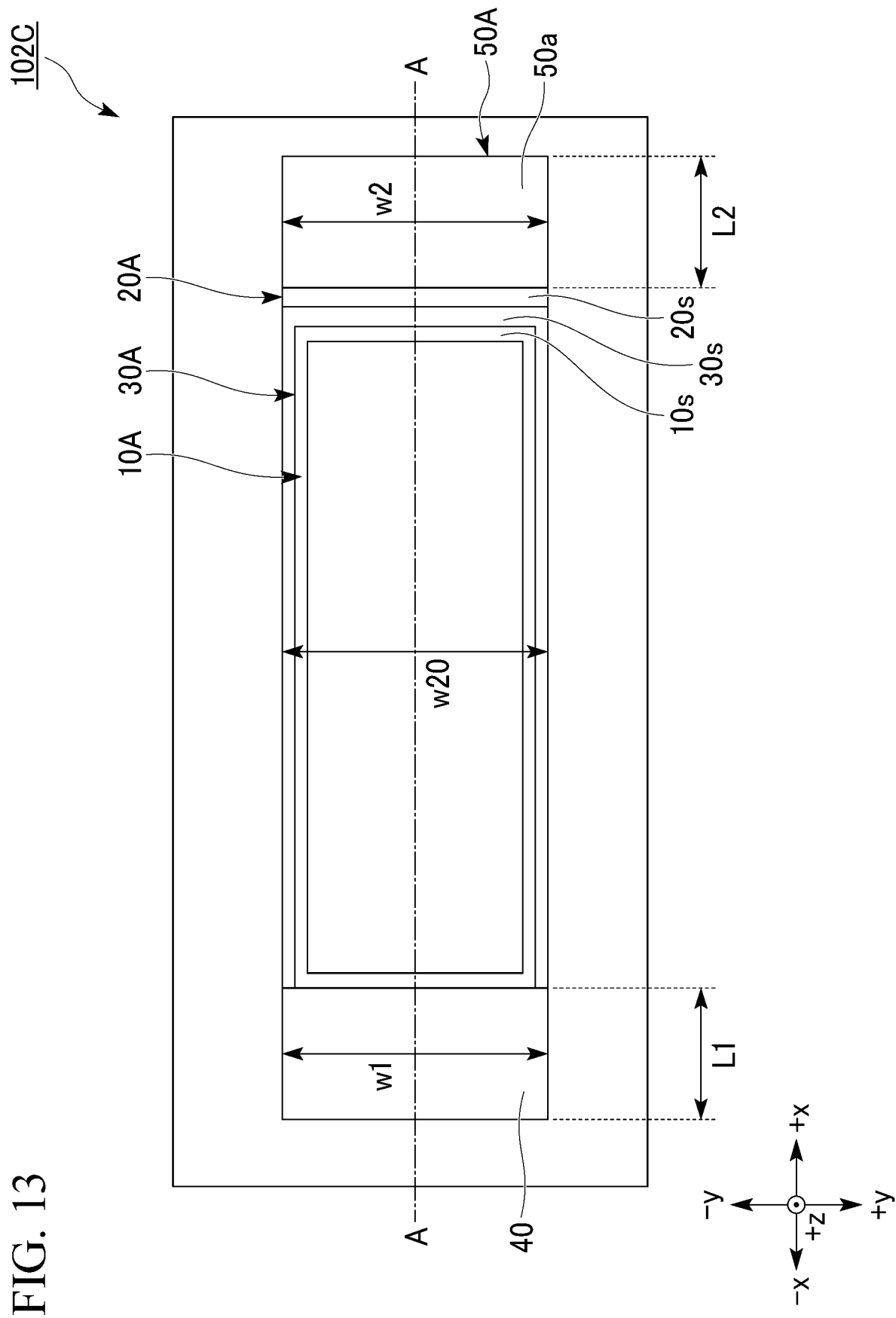
FIG. 13 is a plan view of the magnetic domain wall displacement element according to the third modified example.

FIG. 12 is a cross-sectional view of a magnetic domain wall displacement element 102C according to a third modified example. FIG. 13 is a plan view of the magnetic domain wall displacement element 102C according to the third modified example. The magnetic domain wall displacement element 102C differs from the magnetic domain wall displacement element 102A in that side surfaces 10s and 30s, an inclined surface 20s, and a first surface 50a are continuous. Components the same as those in the magnetic domain wall displacement element 102A will be denoted by the same references, and description thereof will be omitted.

The side surfaces 10s and 30s, the inclined surface 20s, and the first surface 50a are continuous. The magnetic domain wall displacement element 102C has no step between the side surface 30s and the inclined surface 20s.

The magnetic domain wall displacement element 102C is easily formed when the second conductive part 50A is simultaneously processed with the first ferromagnetic layer 10A and the nonmagnetic layer 30A (when the manufacturing conditions illustrated in FIG. 6 are employed). When the second conductive part 50A is simultaneously processed with the first ferromagnetic layer 10A and the nonmagnetic layer 30A, a manufacturing process is simplified. When processing in the y direction of the second conductive part 50A and the first ferromagnetic layer 10A are performed simultaneously with the magnetic recording layer 20A and the nonmagnetic layer 30A, a width w2 in the y direction of the second conductive part 50A substantially coincides with a width w20 in the y direction of the magnetic recording layer 20A.

The magnetic domain wall displacement element 102C according to the third modified example achieves the same effects as in the magnetic domain wall displacement element 102A.

Fourth Modified Example

Figure 14:
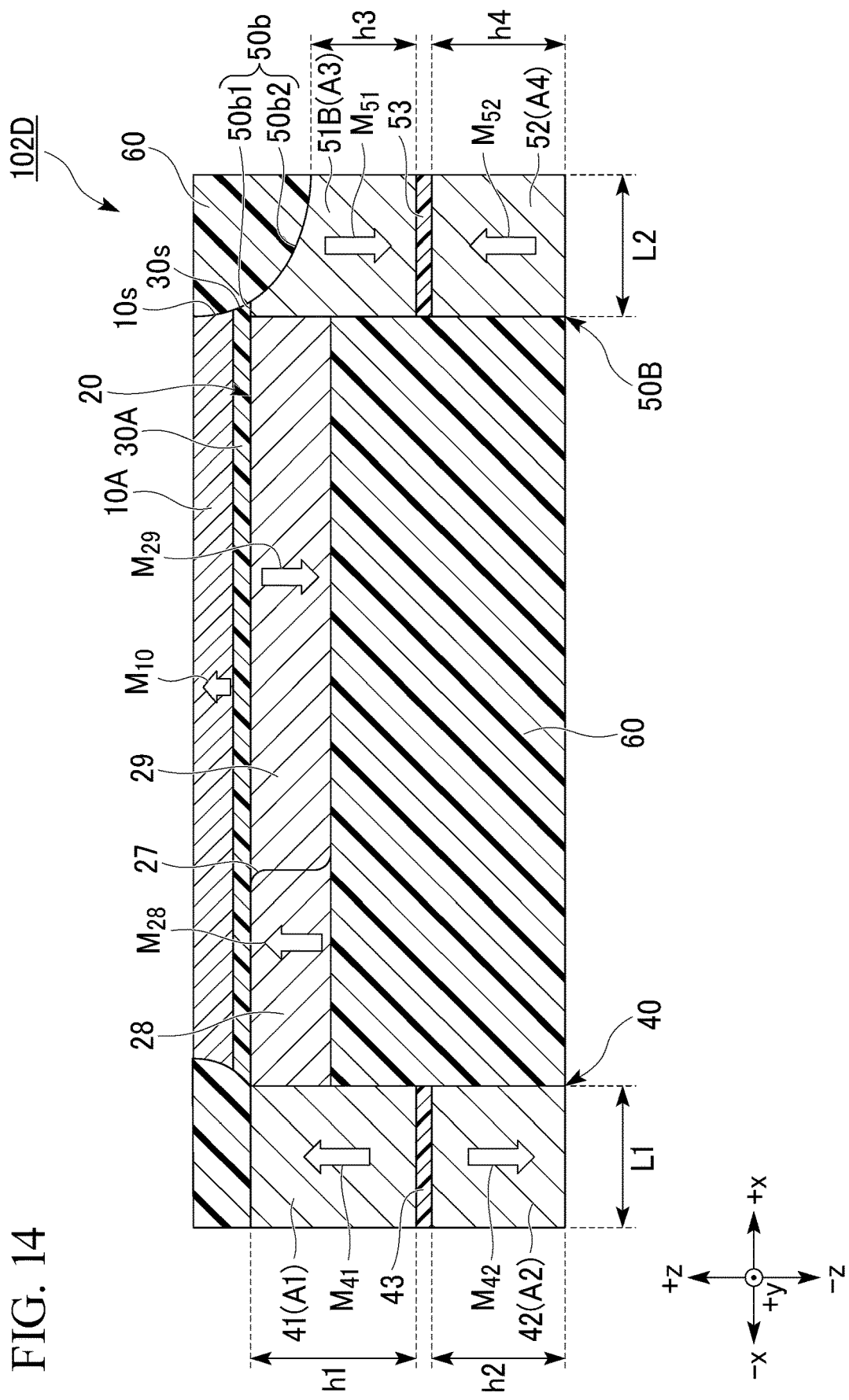
FIG. 14 is a cross-sectional view of a magnetic domain wall displacement element according to a fourth modified example.
Figure 15:
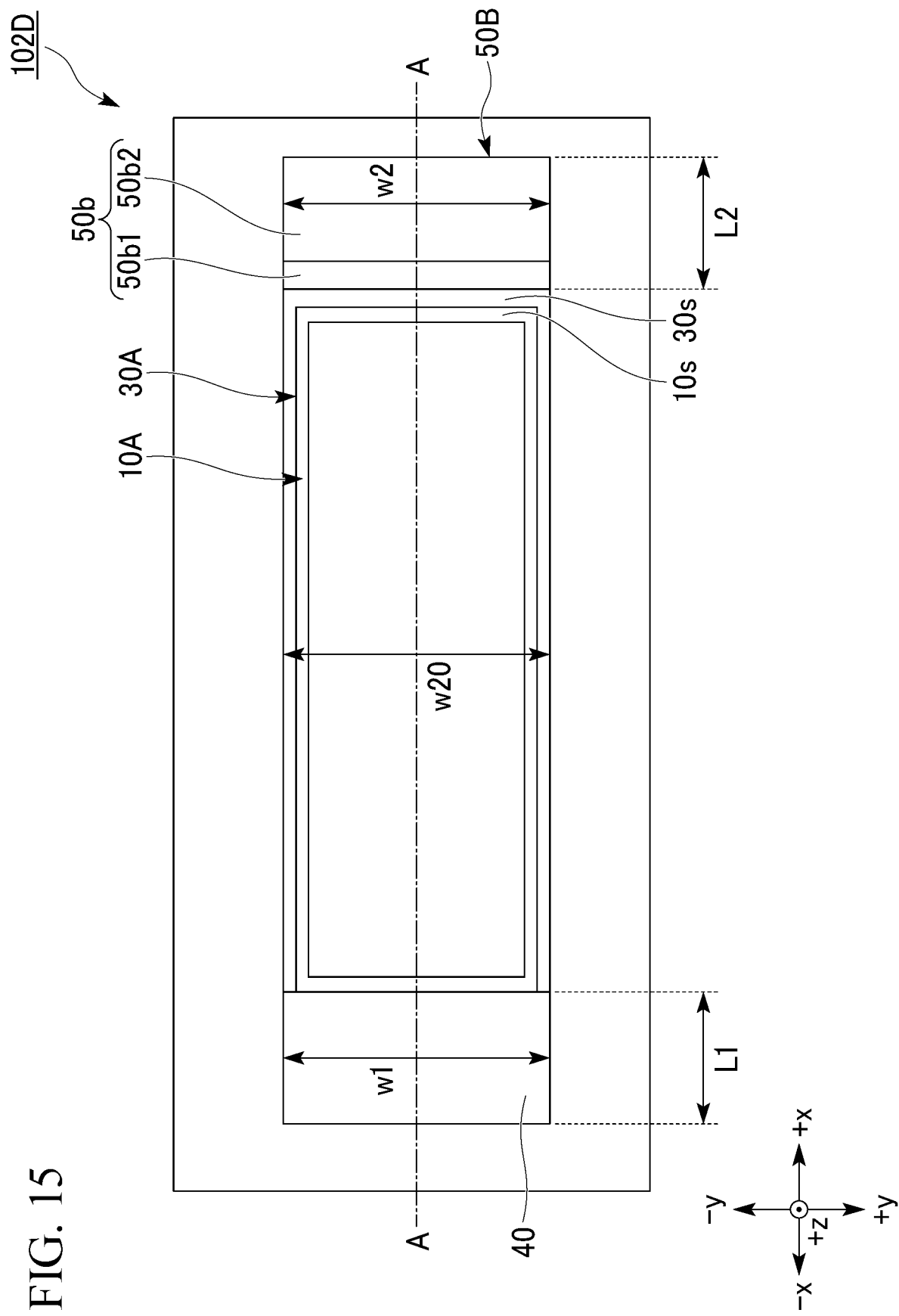
FIG. 15 is a plan view of the magnetic domain wall displacement element according to the fourth modified example.

FIG. 14 is a cross-sectional view of a magnetic domain wall displacement element 102D according to a fourth modified example. FIG. 15 is a plan view of the magnetic domain wall displacement element 102D according to the fourth modified example. The magnetic domain wall displacement element 102D is different from the magnetic domain wall displacement element 102B in that the first ferromagnetic layer 10A and the nonmagnetic layer 30A overlap the second conductive part 50B. Components the same as those in the magnetic domain wall displacement element 102B will be denoted by the same references, and description thereof will be omitted.

The first ferromagnetic layer 10A and the nonmagnetic layer 30A protrude in the +x direction with respect to the magnetic recording layer 20. The magnetic recording layer 20 is hidden by the first ferromagnetic layer 10A and the nonmagnetic layer 30A in a plan view in the +z direction. Part of the nonmagnetic layer 30A is in contact with the flat surface 50b1 of the second conductive part 50B. The side surfaces 10s and 30s and the inclined surface 50b2 are continuous.

The magnetic domain wall displacement element 102D is easily formed when the second conductive part 50B is simultaneously processed with the first ferromagnetic layer 10A and the nonmagnetic layer 30A (when the manufacturing conditions illustrated in FIG. 6 are employed). When the second conductive part 50B is simultaneously processed with the first ferromagnetic layer 10A and the nonmagnetic layer 30A, a manufacturing process is simplified. When processing in the y direction of the second conductive part 50B is performed simultaneously with the first ferromagnetic layer 10A and the nonmagnetic layer 30A, the width w2 in the y direction of the second conductive part 50B substantially coincides with the width w20 in the y direction of the magnetic recording layer 20.

The magnetic domain wall displacement element 102D according to the fourth modified example achieves the same effects as in the magnetic domain wall displacement element 102B.

Fifth Modified Example

Figure 16:
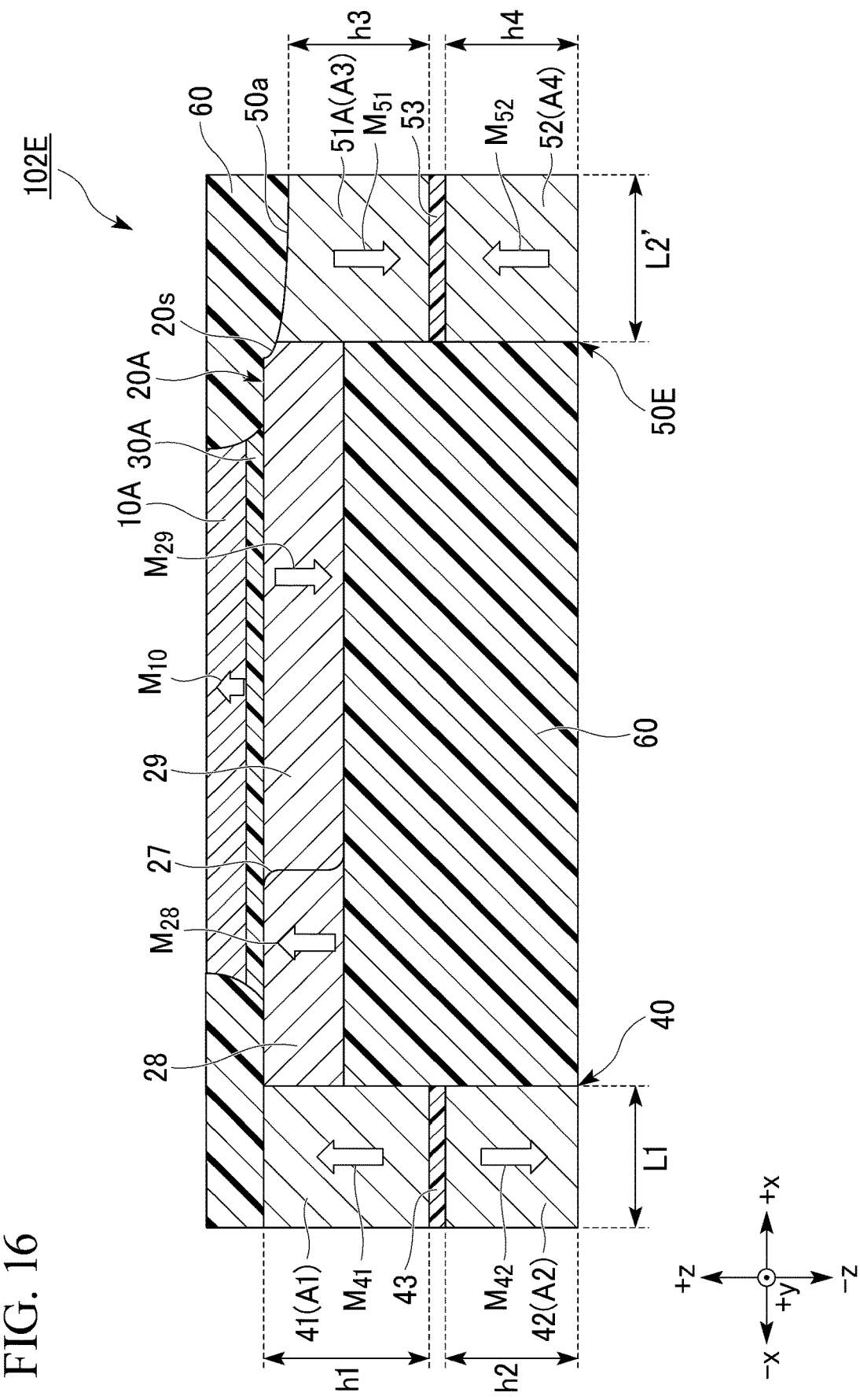
FIG. 16 is a cross-sectional view of a magnetic domain wall displacement element according to a fifth modified example.
Figure 17:
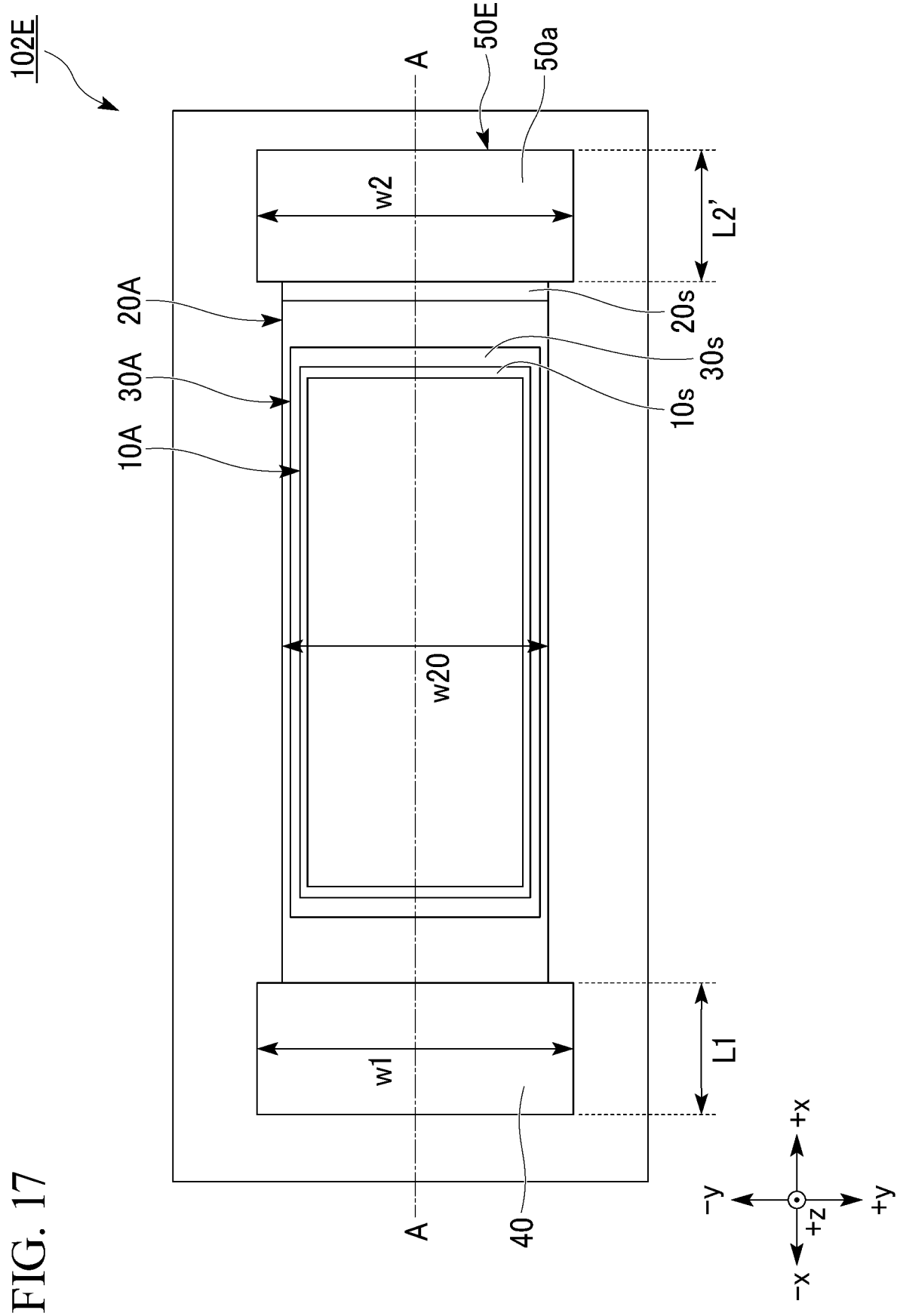
FIG. 17 is a plan view of the magnetic domain wall displacement element according to the fifth modified example.

FIG. 16 is a cross-sectional view of a magnetic domain wall displacement element 102E according to a fifth modified example. FIG. 17 is a plan view of the magnetic domain wall displacement element 102E according to the fifth modified example. The magnetic domain wall displacement element 102E differs from the magnetic domain wall displacement element 102A in a shape of a second conductive part 50E. Components the same as those in the magnetic domain wall displacement element 102A will be denoted by the same references, and description thereof will be omitted.

The second conductive part 50E differs from the magnetic domain wall displacement element 102A in that a length L2' thereof in the x direction is longer than a length L1 in the x direction of the first conductive part 40. When the length L2' in the x direction of the second conductive part 50E is large, an inclination angle of the first surface 50a with respect to the xy plane is made gentle. This is because, for example, even when the same thickness is cut by ion milling, the length L2' in the x direction remains large.

When the inclination angle of the first surface 50a with respect to the xy plane is made gentle, a rapid change in current density at an interface between the magnetic recording layer 20A and the second conductive part 50E can be suppressed. As a result, a flow of a current from the second conductive part 50A to the magnetic recording layer 20A is smoothed, and an intrusion of the magnetic domain wall 27 into the second conductive part 50E can be inhibited.

Third Embodiment

Figure 18:
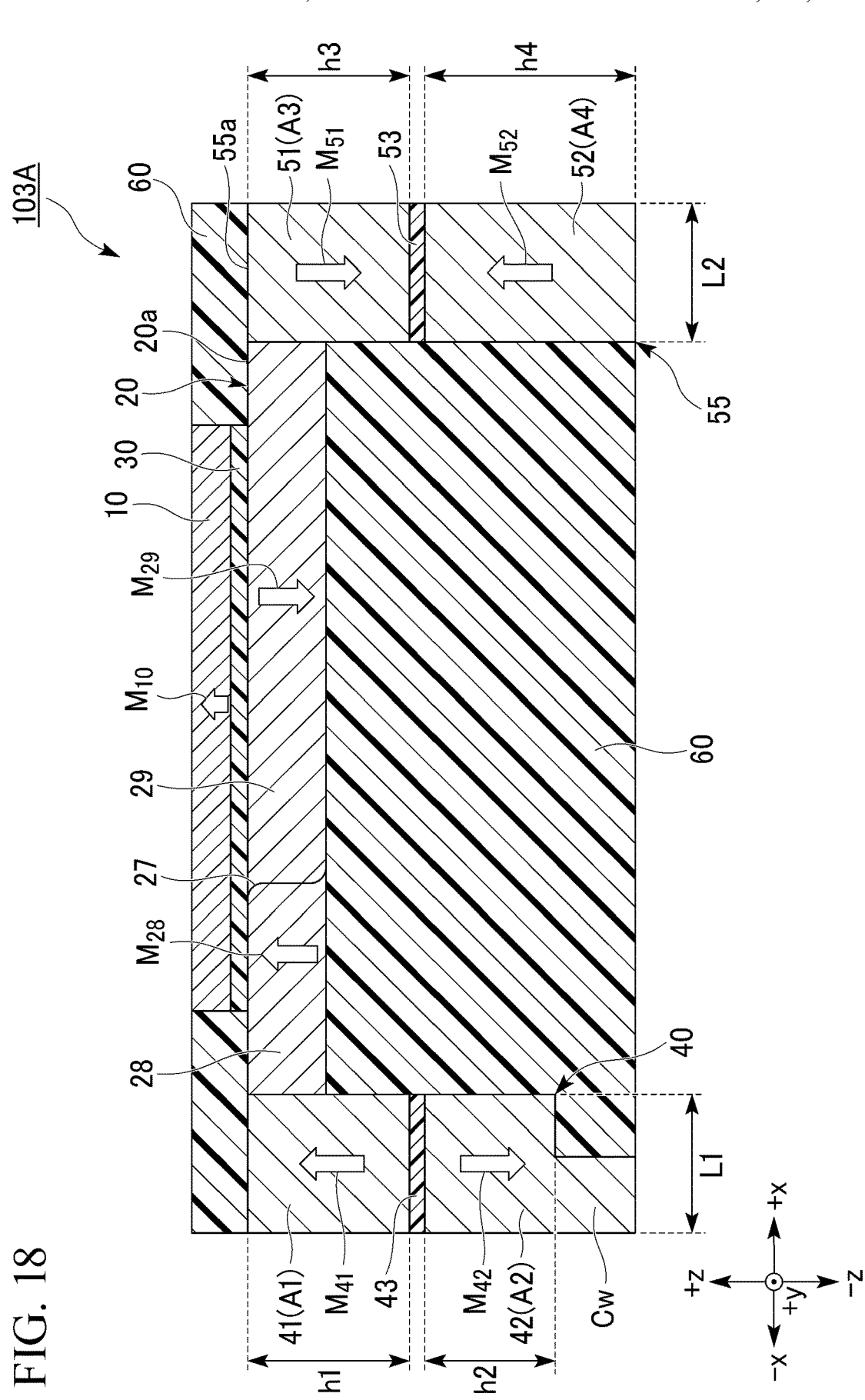
FIG. 18 is a cross-sectional view of a magnetic domain wall displacement element according to a third embodiment.

FIG. 18 is a cross-sectional view of a magnetic domain wall displacement element 103A according to a third embodiment. FIG. 18 is a cross-sectional view of the magnetic domain wall displacement element 103A taken along an xz plane passing through a center of a magnetic recording layer 20 in the y direction. The magnetic domain wall displacement element 103A differs from the magnetic domain wall displacement element 101 illustrated in FIG. 3 in a configuration of a second conductive part 55. Components the same as those in the magnetic domain wall displacement element 101 will be denoted by the same references, and description thereof will be omitted.

The second conductive part 55 includes a third magnetic layer 51, a fourth magnetic layer 52, and a second intermediate layer 53. A first surface 55a of the second conductive part 55 is at the same height position as s first surface 20a of the magnetic recording layer 20. The first surface 55a and the first surface 20a form a flat surface.

A thickness h1 of a first magnetization region A1 and a thickness h3 of a third magnetization region A3 may be, for example, the same (substantially the same). An area of the first magnetization region A1 and an area of the third magnetization region A3 may be, for example, the same (substantially the same). On the other hand, a thickness h2 of a second magnetization region A2 is thinner than a thickness h4 of a fourth magnetization region A4. An area of the second magnetization region A2 is smaller than an area of the fourth magnetization region A4.

Since the first magnetization region A1 has a larger coercive force energy than the second magnetization region A2, and the third magnetization region A3 has a smaller coercive force energy than the fourth magnetization region A4, the magnetic domain wall displacement element 103A according to the third embodiment achieves the same effects as in the magnetic domain wall displacement element 101 according to the first embodiment.

Sixth Modified Example

Figure 19:
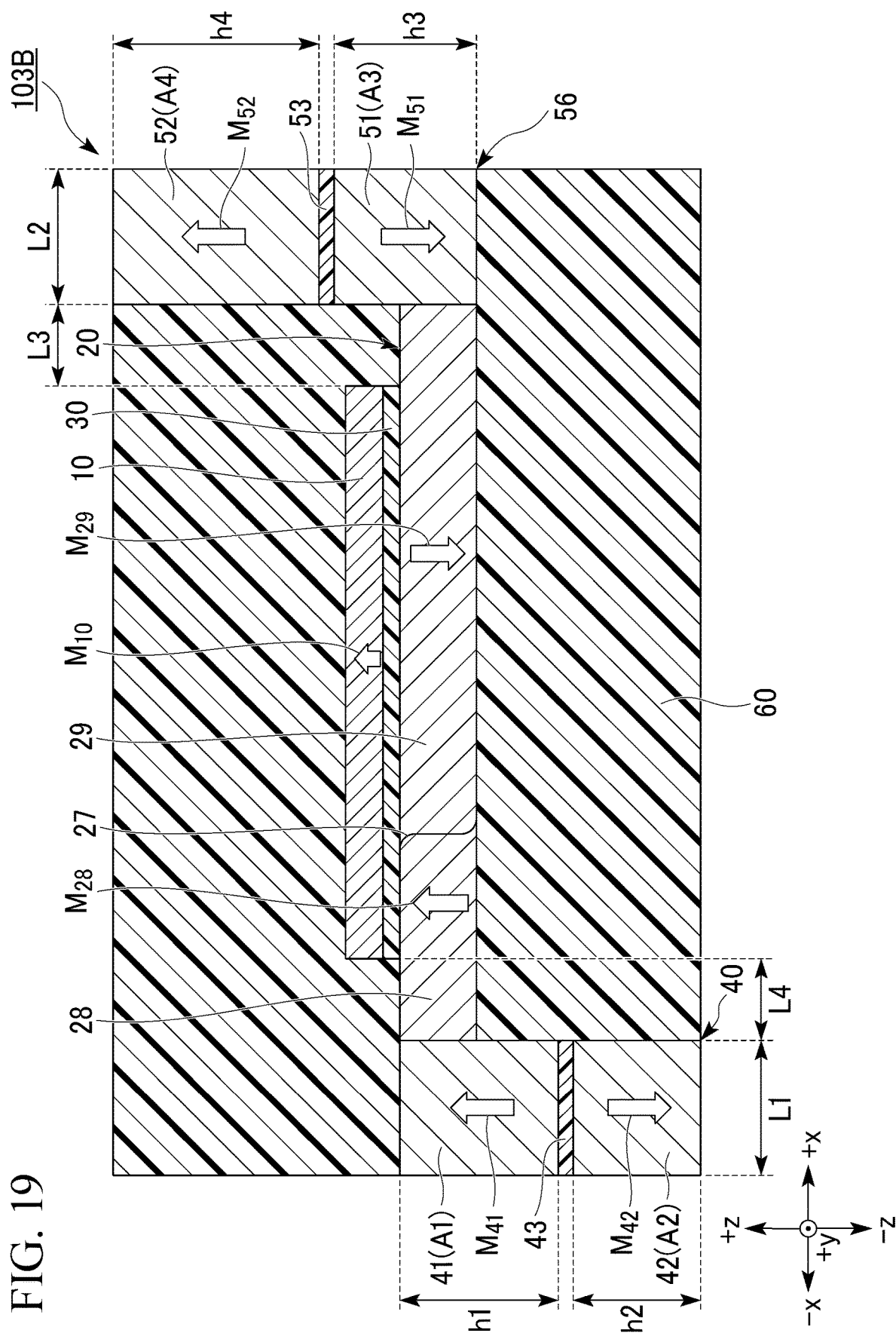
FIG. 19 is a cross-sectional view of a magnetic domain wall displacement element according to a sixth modified example.

FIG. 19 is a cross-sectional view of a magnetic domain wall displacement element 103B according to a sixth modified example. The magnetic domain wall displacement element 103B illustrated in FIG. 19 is different from the magnetic domain wall displacement element 103A illustrated in FIG. 18 in that a second conductive part 56 extends in the +z direction. Components the same as those in the magnetic domain wall displacement element 103A will be denoted by the same references, and description thereof will be omitted.

As in the magnetic domain wall displacement element 103B illustrated in the sixth modified example, directions in which a first conductive part 40 and the second conductive part 56 extend may be different. The first conductive part 40 and the second conductive part 56 extend in different directions with respect to the magnetic recording layer 20. A semiconductor device is formed for each layer. Directions in which the first conductive part 40 and the second conductive part 56 extend may be different due to routing of interconnections or the like.

A distance L3 in the x direction between the second conductive part 56 and a first ferromagnetic layer 10 may be longer than, for example, a distance L4 in the x direction between the first conductive part 40 and the first ferromagnetic layer 10. The second conductive part 56 is a conductive part that extends in the same direction as a direction in which the first ferromagnetic layer 10 is laminated with respect to the magnetic recording layer 20. The first conductive part 40 is a conductive part that extends in a direction opposite to the direction in which the first ferromagnetic layer 10 is laminated with respect to the magnetic recording layer 20. When the second conductive part 56 and the first ferromagnetic layer 10 are separated, the second conductive part 56 can easily be processed.

Fourth Embodiment

Figure 20:
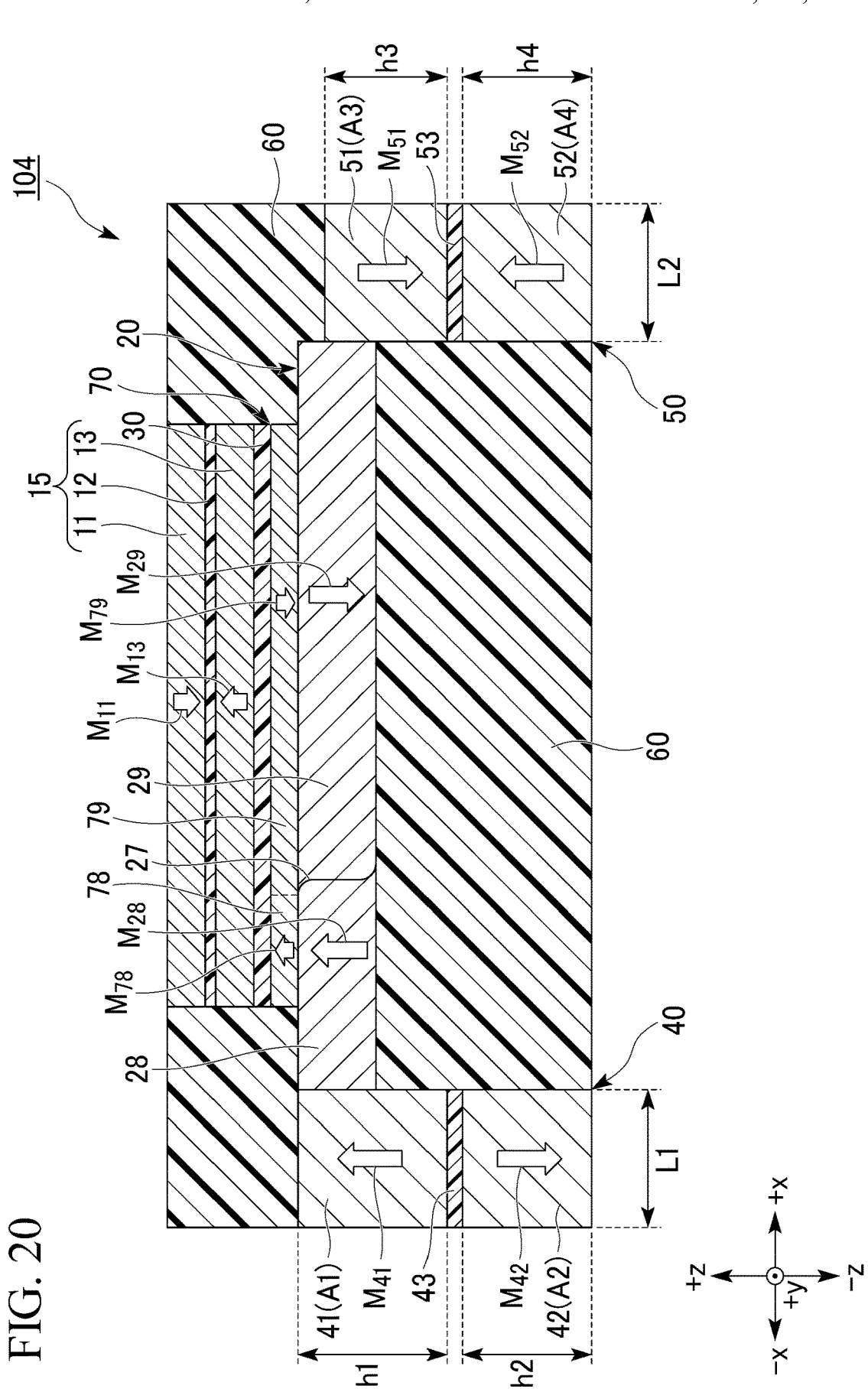
FIG. 20 is a cross-sectional view of a magnetic domain wall displacement element according to a fourth embodiment.

FIG. 20 is a cross-sectional view of a magnetic domain wall displacement element 104 according to a fourth embodiment. FIG. 20 is a cross-sectional view of the magnetic domain wall displacement element 104 taken along an xz plane passing through a center of a magnetic recording layer 20 in the y direction. The magnetic domain wall displacement element 104 differs from the magnetic domain wall displacement element 101 illustrated in FIG. 3 in a configuration of a first ferromagnetic layer 15 and a provision of a third ferromagnetic layer 70. Description of components the same as those in the magnetic domain wall displacement element 101 will be omitted.

The third ferromagnetic layer 70 is positioned between the magnetic recording layer 20 and a nonmagnetic layer 30. The third ferromagnetic layer 70 contains a magnetic material. The third ferromagnetic layer 70 reflects a magnetic state of the magnetic recording layer 20. The same magnetic material as that of the first ferromagnetic layer 10 according to the first embodiment can be used for the magnetic material constituting the third ferromagnetic layer 70.

The third ferromagnetic layer 70 and the magnetic recording layer 20 are adjacent to each other. An intermediate layer may be disposed between the third ferromagnetic layer 70 and the magnetic recording layer 20. The intermediate layer may be formed of, for example, Ru.

Magnetizations $M_{78}$ and $M_{79}$ of the third ferromagnetic layer 70 are magnetically coupled to magnetizations $M_{28}$ and $M_{29}$ of the magnetic recording layer 20. The third ferromagnetic layer 70 reflects a magnetic state of the magnetic recording layer 20. When the third ferromagnetic layer 70 and the magnetic recording layer 20 are ferromagnetically coupled, a magnetic state of the third ferromagnetic layer 70 is the same as a magnetic state of the magnetic recording layer 20. When the third ferromagnetic layer 70 and the magnetic recording layer 20 are antiferromagnetically coupled, a magnetic state of the third ferromagnetic layer 70 is opposite to a magnetic state of the magnetic recording layer 20. A first magnetic domain 78 and a second magnetic domain 79 are formed inside the third ferromagnetic layer 70.

A magnetoresistance change (MR ratio) of the magnetic domain wall displacement element 104 is generated according to a change in magnetization states of two magnetic materials (a fifth ferromagnetic layer 13 and the third ferromagnetic layer 70) sandwiching the nonmagnetic layer 30. The third ferromagnetic layer 70 preferably contains a material that tends to obtain a coherent tunnel effect with the first ferromagnetic layer 15. On the other hand, the magnetic recording layer 20 preferably contains a material that makes a displacement speed of the magnetic domain wall 27 slow.

The first ferromagnetic layer 15 includes a fourth ferromagnetic layer 11, a third intermediate layer 12, and the fifth ferromagnetic layer 13. A material constituting the fifth ferromagnetic layer 13 is the same as that of the first ferromagnetic layer 10 according to the first embodiment. The fourth ferromagnetic layer 11 may be formed of, for example, the same material as the first ferromagnetic layer 10, and may be formed of IrMn, PtMn, or the like. A material constituting the third intermediate layer 12 is the same as that of a first intermediate layer 43. Magnetization $M_{11}$ of the fourth ferromagnetic layer 11 and magnetization $M_{13}$ of the fifth ferromagnetic layer 13 are antiferromagnetically coupled. When the fourth ferromagnetic layer 11 and the fifth ferromagnetic layer 13 are antiferromagnetically coupled, a coercive force of the fourth ferromagnetic layer 11 and the fifth ferromagnetic layer 13 increases. The first ferromagnetic layer 15 has a synthetic antiferromagnetic structure (SAF structure).

Since a first magnetization region A1 has a larger coercive force energy than a second magnetization region A2, and a third magnetization region A3 has a smaller coercive force energy than a fourth magnetization region A4, the magnetic domain wall displacement element 104 according to the fourth embodiment achieves the same effects as in the magnetic domain wall displacement element 101 according to the first embodiment. Also, since the first ferromagnetic layer 15 has a SAF structure, a coercive force of the fourth ferromagnetic layer 11 is large, and an MR ratio thereof is improved. Further, since the magnetic recording layer 20 is no longer two magnetic materials sandwiching the nonmagnetic layer 30, a degree of freedom in selecting a material of the magnetic recording layer 20 increases.

Seventh Modified Example

Figure 21:
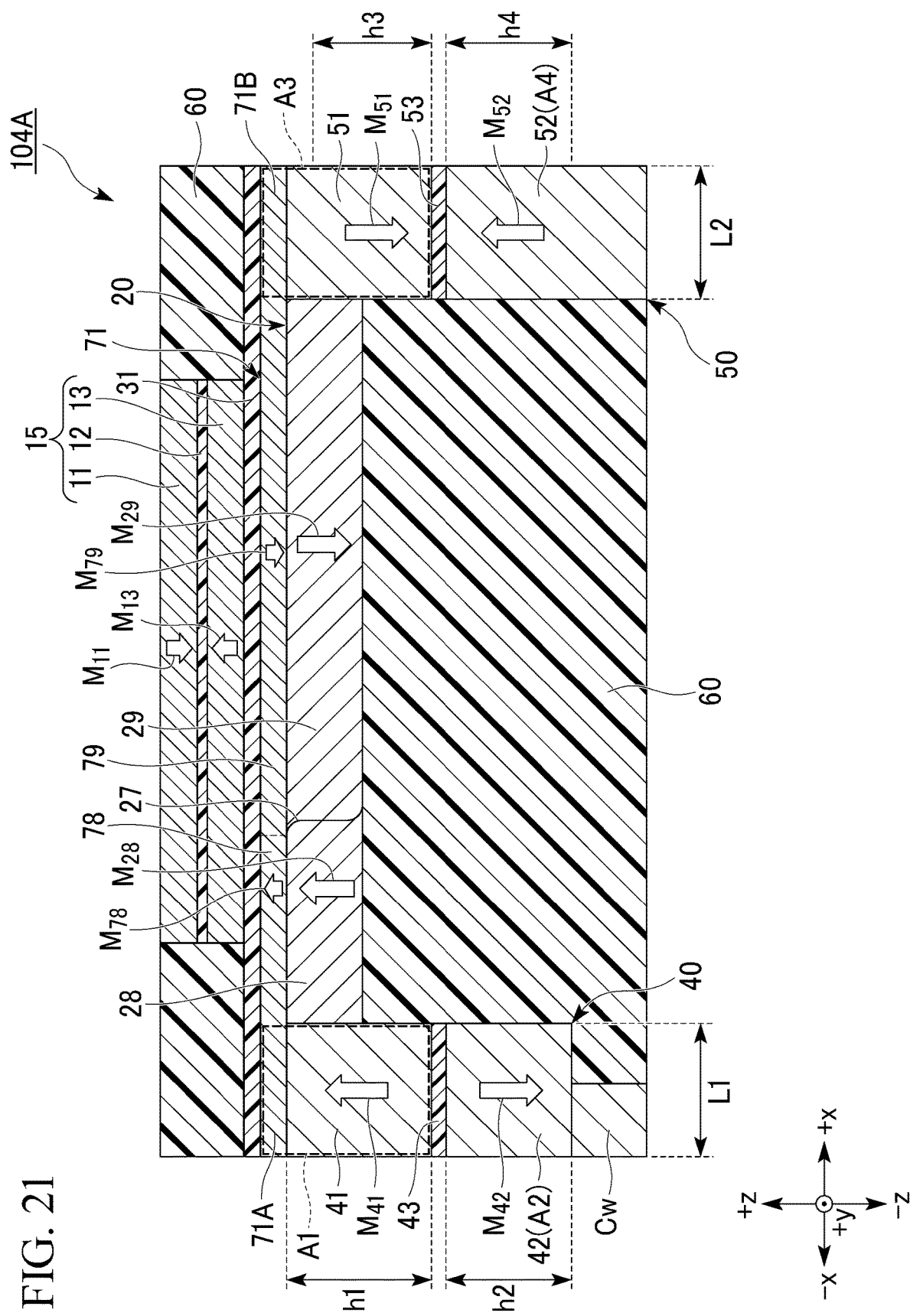
FIG. 21 is a cross-sectional view of a magnetic domain wall displacement element according to a seventh modified example.

FIG. 21 is a cross-sectional view of a magnetic domain wall displacement element 104A according to a seventh modified example. The magnetic domain wall displacement element 104A illustrated in FIG. 21 differs from the magnetic domain wall displacement element 104 illustrated in FIG. 20 in that a nonmagnetic layer 31 and a third ferromagnetic layer 71 extend to a position overlapping a first conductive part 40 and a second conductive part 55 in the z direction. Components the same as those in the magnetic domain wall displacement element 104 will be denoted by the same references, and description thereof will be omitted.

The third ferromagnetic layer 71 has a first superposition region 71A overlapping the first conductive part 40 in the z direction, and a second superposition region 71B overlapping the second conductive part 55 in the z direction. The first magnetization region A1 includes a first magnetic layer 41 and the first superposition region 71A. The third magnetization region A3 includes a third magnetic layer 51 and the second superposition region 71B.

Also in the magnetic domain wall displacement element 104A according to the seventh modified example, the same effects as those of the magnetic domain wall displacement element 104 according to the fourth embodiment can be obtained.

Fifth Embodiment

Figure 22:
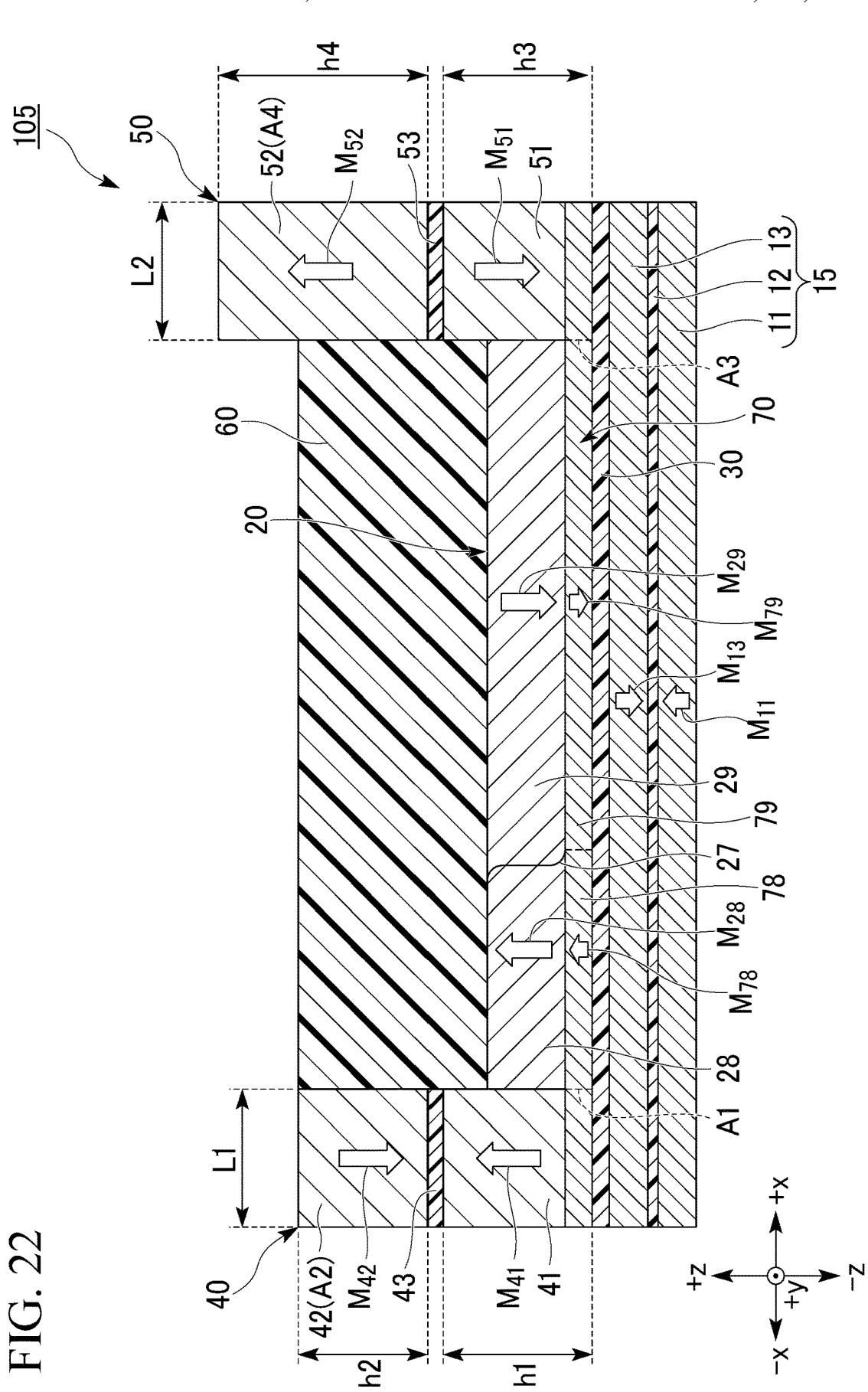
FIG. 22 is a cross-sectional view of a magnetic domain wall displacement element according to a fifth embodiment.

FIG. 22 is a cross-sectional view of a magnetic domain wall displacement element 105 according to a fifth embodiment. FIG. 22 is a cross-sectional view of the magnetic domain wall displacement element 105 taken along an xz plane passing through a center of a magnetic recording layer 20 in the y direction. The magnetic domain wall displacement element 105 has a bottom pin structure in which a first ferromagnetic layer 15 is positioned closer to a substrate Sub than the magnetic recording layer 20. Components the same as those in FIG. 20 will be denoted by the same references, and description thereof will be omitted.

The first ferromagnetic layer 15, a nonmagnetic layer 30, and a third ferromagnetic layer 70 overlap the magnetic recording layer 20, a first conductive part 40, and a second conductive part 50 in the z direction.

A first intermediate layer 43 is sandwiched between a first magnetization region A1 and a second magnetization region A2 in the z direction. A portion of the third ferromagnetic layer 70 overlapping a first magnetic layer 41 in the z direction is magnetically coupled to the first magnetic layer 41. Therefore, the first magnetization region A1 in the magnetic domain wall displacement element 105 is a region in which the first magnetic layer 41 and the portion of the third ferromagnetic layer 70 overlapping the first magnetic layer 41 in the z direction are combined. The second magnetization region A2 coincides with a second magnetic layer 42.

A second intermediate layer 53 is sandwiched between a third magnetization region A3 and a fourth magnetization region A4 in the z direction. A portion of the third ferromagnetic layer 70 overlapping a third magnetic layer 51 in the z direction is magnetically coupled to the third magnetic layer 51. Therefore, the third magnetization region A3 in the magnetic domain wall displacement element 105 is a region in which the third magnetic layer 51 and the portion of the third ferromagnetic layer 70 overlapping the third magnetic layer 51 in the z direction are combined. The fourth magnetization region A4 coincides with a fourth magnetic layer 52.

Also in the magnetic domain wall displacement element 105, an area of the first magnetization region A1 is larger than an area of the second magnetization region A2. Also in the magnetic domain wall displacement element 105, an area of the third magnetization region A3 is smaller than an area of the fourth magnetization region A4. A thickness h1 of the first magnetization region A1 is thicker than a thickness h2 of the second magnetization region A2, and a thickness h3 of the third magnetization region A3 is thinner than a thickness h4 of the fourth magnetization region A4. A thickness difference between the thickness h2 of the second magnetization region A2 and the thickness h4 of the fourth magnetization region A4 is caused, for example, by milling the first conductive part 40.

Since the first magnetization region A1 has a larger coercive force energy than the second magnetization region A2, and the third magnetization region A3 has a smaller coercive force energy than the fourth magnetization region A4, the magnetic domain wall displacement element 105 according to the fifth embodiment achieves the same effects as in the magnetic domain wall displacement element 101 according to the first embodiment.

Figure 23:
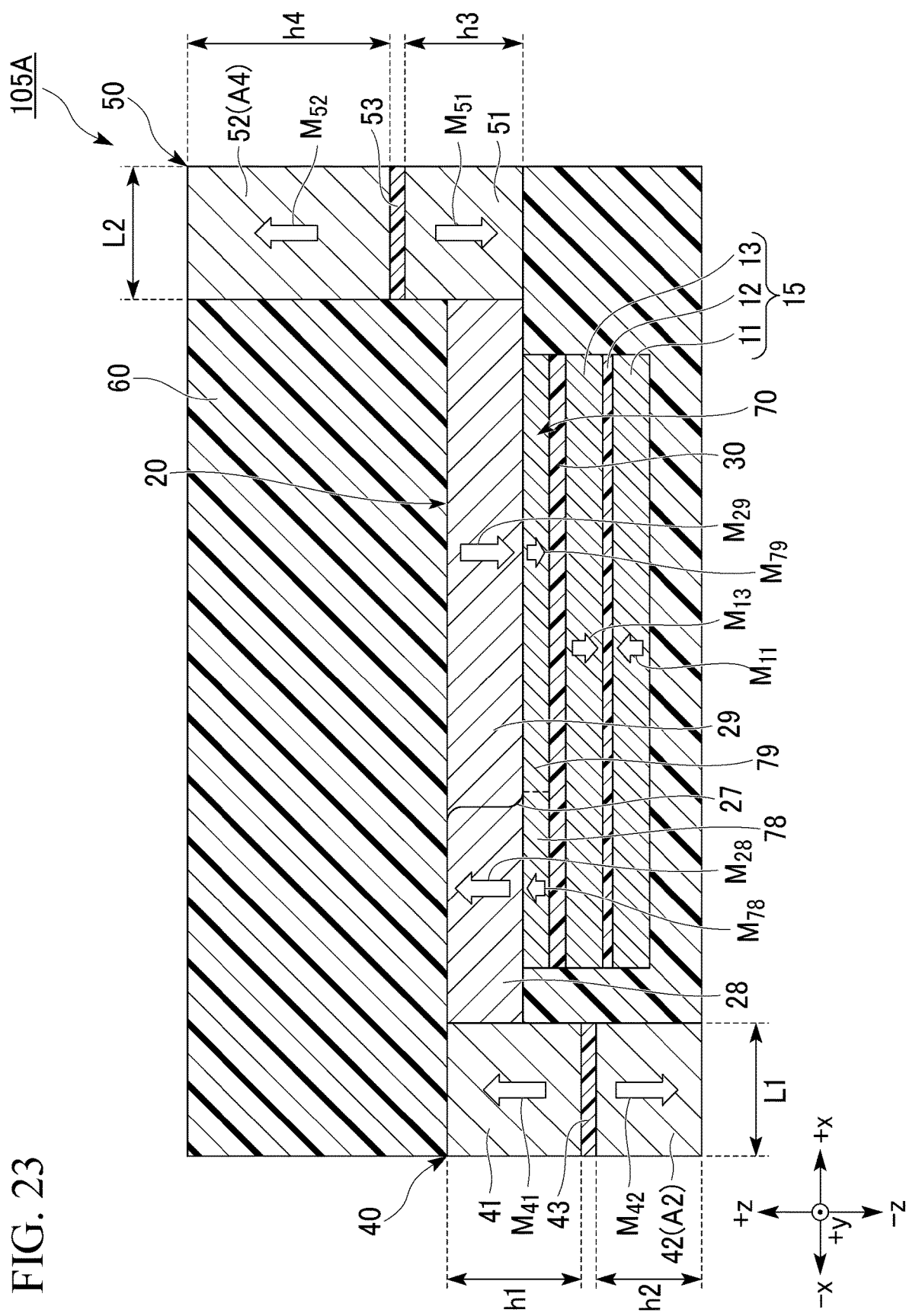
FIG. 23 is a cross-sectional view of a modified example of the magnetic domain wall displacement element according to the fifth embodiment.

Also, FIG. 23 is a modified example of the magnetic domain wall displacement element according to the fifth embodiment. Also in a bottom pin structure as in a magnetic domain wall displacement element 105A illustrated in FIG. 23, a direction in which the first conductive part 40 extends and a direction in which the second conductive part 50 extends may be different with respect to the magnetic recording layer 20.

Sixth Embodiment

Figure 24:
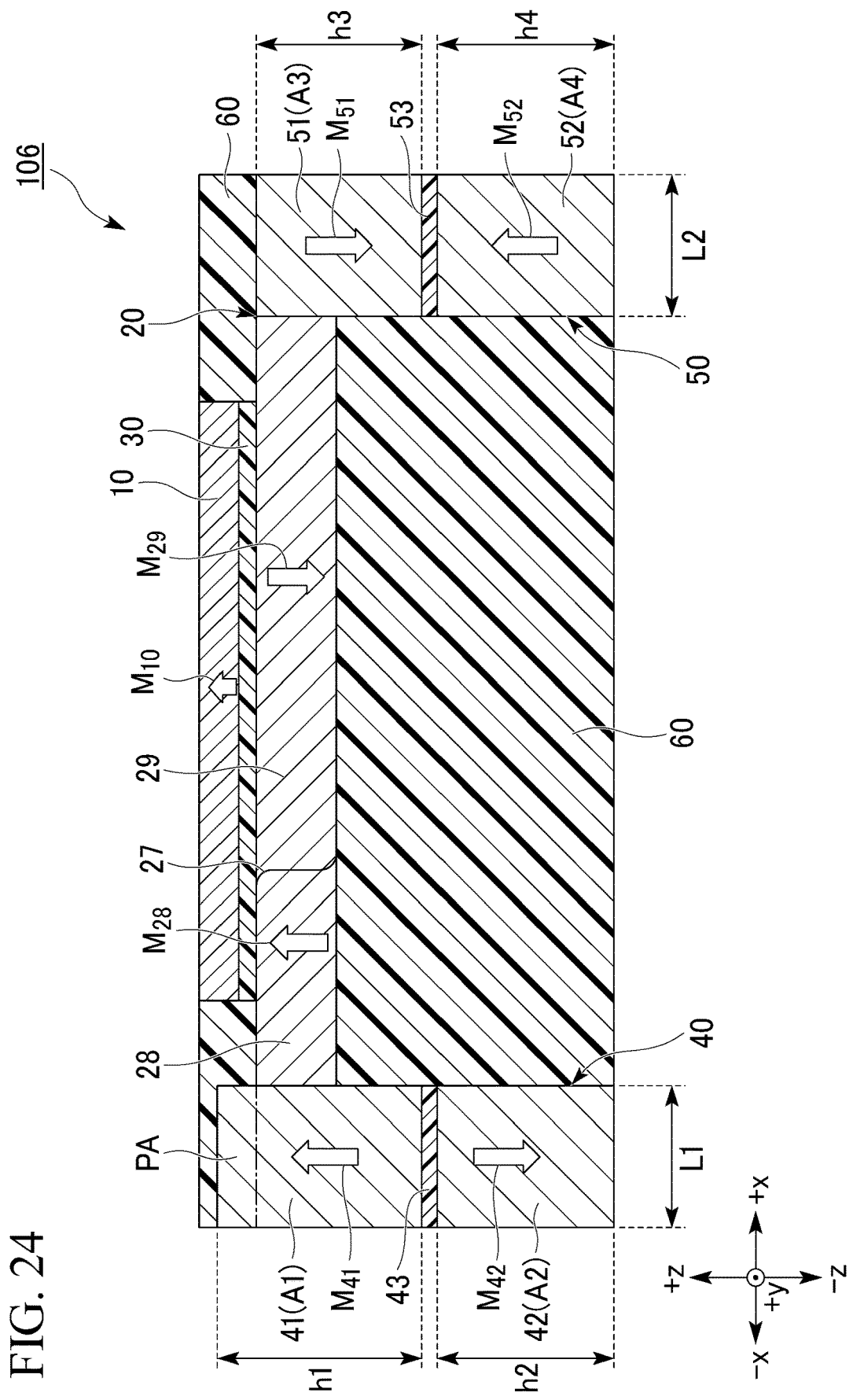
FIG. 24 is a cross-sectional view of a magnetic domain wall displacement element according to a sixth embodiment.

FIG. 24 is a cross-sectional view of a magnetic domain wall displacement element 106 according to a sixth embodiment. FIG. 24 is a cross-sectional view of the magnetic domain wall displacement element 106 taken along an xz plane passing through a center of a magnetic recording layer 20 in the y direction. The magnetic domain wall displacement element 106 differs from the magnetic domain wall displacement element 101 illustrated in FIG. 3 in that part of the first conductive part 40 protrudes with respect to the magnetic recording layer 20 in the z direction. Description of components the same as those in the magnetic domain wall displacement element 101 will be omitted.

The first conductive part 40 includes a protruding part PA that protrudes with respect to the magnetic recording layer 20 in the z direction. The protruding part PA belongs to a first magnetic layer 41 and belongs to a first magnetization region A1. The protruding part PA protrudes with respect to the magnetic recording layer 20 toward a side opposite to a side in which the first conductive part 40 extends with respect to the magnetic recording layer 20. In FIG. 24, the first conductive part 40 extends in the −z direction with respect to the magnetic recording layer 20, and the protruding part PA protrudes in the +z direction with respect to the magnetic recording layer 20.

In FIGS. 5 and 6, a difference between the thicknesses h1 and h3 of the first magnetic layer 41 and the third magnetic layer 51 is made by milling part of each layer after laminating the layers. On the other hand, in the present embodiment, a difference between thicknesses h1 and h3 of the first magnetic layer 41 and a third magnetic layer 51 can be made by additionally laminating the protruding part PA after laminating the layers.

Since the first magnetization region A1 has a larger coercive force energy than a second magnetization region A2, and a third magnetization region A3 has a smaller coercive force energy than a fourth magnetization region A4, the magnetic domain wall displacement element 106 according to the sixth embodiment achieves the same effects as in the magnetic domain wall displacement element 101 according to the first embodiment.

While preferred embodiments of the present invention have been described above, the present invention is not limited to such specific embodiments, and various modifications and changes can be made within the gist of the present invention described in the claim.

For example, characteristic configurations in the first to fifth embodiments may be combined. Also, modified examples of each embodiment may be applied to other embodiments.

EXPLANATION OF REFERENCES 10, 10A, 15 First ferromagnetic layer
11 Fourth ferromagnetic layer
12 Third intermediate layer
13 Fifth ferromagnetic layer
20 Magnetic recording layer
27 Magnetic domain wall
28, 78 First magnetic domain
29, 79 Second magnetic domain
30, 30A, 31 Nonmagnetic layer
40 First conductive part
41 First magnetic layer
42 Second magnetic layer
43 First intermediate layer 50, 50A, 50B, 50E, 55, 56 Second conductive part
51, MA, 51B Third magnetic layer
52 Fourth magnetic layer
53 Second intermediate layer
60 Insulating layer
70, 71 Third ferromagnetic layer
71A First superposition region
71B Second superposition region
101, 101A, 102A, 102B, 102C, 102D, 102E, 103A, 103B, 104, 104A, 105, 105A, 106 Magnetic domain wall displacement element
110 First switching element
120 Second switching element
130 Third switching element
200 Magnetic recording array
A1 First magnetization region
A2 Second magnetization region
A3 Third magnetization region
A4 Fourth magnetization region

What is claimed is:

1. A magnetic domain wall displacement element comprising:
    a first ferromagnetic layer;
    a second ferromagnetic layer positioned in a first direction with respect to the first ferromagnetic layer, extending in a second direction different from the first direction, and magnetically recordable;
    a nonmagnetic layer positioned between the first ferromagnetic layer and the second ferromagnetic layer; and
    a first conductive part including a first intermediate layer and a second conductive part including a second intermediate layer which are spaced apart from each other and connected to the second ferromagnetic layer, wherein
    the first intermediate layer is sandwiched between a first magnetization region exhibiting a first magnetization direction and a second magnetization region exhibiting a second magnetization direction different from the first magnetization direction in the first direction,
    the second intermediate layer is sandwiched between a third magnetization region exhibiting the second magnetization direction and a fourth magnetization region exhibiting the first magnetization direction in the first direction,
    an area of the first magnetization region is larger than an area of the second magnetization region and an area of the third magnetization region is smaller than an area of the fourth magnetization region in a cross section in the first direction and the second direction, and
    a first surface of the third magnetization region on a side opposite to a surface of the third magnetization region in contact with the second intermediate layer in the first direction is inclined with respect to a surface perpendicular to the first direction.

2. The magnetic domain wall displacement element according to claim 1, wherein the area of the first magnetization region is larger than the area of the third magnetization region.

3. The magnetic domain wall displacement element according to claim 1, wherein the area of the second magnetization region is different from the area of the fourth magnetization region.

4. The magnetic domain wall displacement element according to claim 1, wherein the area of the second magnetization region is equal to the area of the fourth magnetization region.

5. The magnetic domain wall displacement element according to claim 1, wherein the first magnetization region and the third magnetization region are each formed of a single material.

6. The magnetic domain wall displacement element according to claim 1, wherein the first magnetization region and the third magnetization region are each formed of a plurality of layers.

7. The magnetic domain wall displacement element according to claim 1, wherein the first magnetization region and the third magnetization region include the same material as the second ferromagnetic layer.

8. The magnetic domain wall displacement element according to claim 1, wherein a height position in the first direction of the first intermediate layer and a height position in the first direction of the second intermediate layer are the same.

9. The magnetic domain wall displacement element according to claim 1, wherein a cross-sectional area of the first magnetization region and the third magnetization region taken along a plane perpendicular to the second direction is larger than a cross-sectional area of the second ferromagnetic layer taken along a plane perpendicular to the second direction.

10. The magnetic domain wall displacement element according to claim 1, further comprising a third ferromagnetic layer between the nonmagnetic layer and the second ferromagnetic layer.

11. The magnetic domain wall displacement element according to claim 1, wherein
    the first conductive part and the second conductive part extend in the first direction with respect to the second ferromagnetic layer, and
    the first magnetization region protrudes with respect to the second ferromagnetic layer toward a side opposite to a side in which the first conductive part extends, or
    the third magnetization region protrudes with respect to the second ferromagnetic layer toward a side opposite to a side in which the second conductive part extends.

12. A magnetic recording array comprising a plurality of magnetic domain wall displacement elements according to claim 1.

13. A semiconductor device comprising:
    a magnetic domain wall displacement element according to claim 1; and
    a plurality of switching elements electrically connected to the magnetic domain wall displacement element.

14. The magnetic domain wall displacement element according to claim 1, wherein
    the first magnetization region is closer to the second ferromagnetic layer than the second magnetization region, and
    the third magnetization region is closer to the second ferromagnetic layer than the fourth magnetization region.

15. A magnetic domain wall displacement element comprising:
    a first ferromagnetic layer;
    a second ferromagnetic layer positioned in a first direction with respect to the first ferromagnetic layer, extending in a second direction different from the first direction, and magnetically recordable;
    a nonmagnetic layer positioned between the first ferromagnetic layer and the second ferromagnetic layer; and
    a first conductive part including a first intermediate layer and a second conductive part including a second intermediate layer which are spaced apart from each other and connected to the second ferromagnetic layer, wherein the first intermediate layer is sandwiched between a first magnetization region exhibiting a first magnetization direction and a second magnetization region exhibiting a second magnetization direction different from the first magnetization direction in the first direction, the second intermediate layer is sandwiched between a third magnetization region exhibiting the second magnetization direction and a fourth magnetization region exhibiting the first magnetization direction in the first direction, an area of the first magnetization region is larger than an area of the second magnetization region and an area of the third magnetization region is smaller than an area of the fourth magnetization region in a cross section in the first direction and the second direction, and a length of the second conductive part in the second direction is longer than a length of the first conductive part in the second direction.

16. The magnetic domain wall displacement element according to claim 15, wherein the first magnetization region is closer to the second ferromagnetic layer than the second magnetization region, and the third magnetization region is closer to the second ferromagnetic layer than the fourth magnetization region.

17. A magnetic domain wall displacement element comprising:

a first ferromagnetic layer;

a second ferromagnetic layer positioned in a first direction with respect to the first ferromagnetic layer, extending in a second direction different from the first direction, and magnetically recordable;

a nonmagnetic layer positioned between the first ferromagnetic layer and the second ferromagnetic layer; and a first conductive part including a first intermediate layer and a second conductive part including a second intermediate layer which are spaced apart from each other and connected to the second ferromagnetic layer, wherein the first intermediate layer is sandwiched between a first magnetization region exhibiting a first magnetization direction and a second magnetization region exhibiting a second magnetization direction different from the first magnetization direction in the first direction, the second intermediate layer is sandwiched between a third magnetization region exhibiting the second magnetization direction and a fourth magnetization region exhibiting the first magnetization direction in the first direction, an area of the first magnetization region is larger than an area of the second magnetization region and an area of the third magnetization region is smaller than an area of the fourth magnetization region in a cross section in the first direction and the second direction, and the first conductive part and the second conductive part extend in opposite directions in the first direction with respect to the second ferromagnetic layer.

18. The magnetic domain wall displacement element according to claim 17, wherein a distance in the second direction between a conductive part of the first conductive part or the second conductive part extending in the same direction as a direction in which the first ferromagnetic layer is laminated with respect to the second ferromagnetic layer and the first ferromagnetic layer is longer than a distance in the second direction between a conductive part of the first conductive part or the second conductive part extending in a direction opposite to a side in which the first ferromagnetic layer is laminated with respect to the second ferromagnetic layer and the first ferromagnetic layer.

19. The magnetic domain wall displacement element according to claim 17, wherein the first magnetization region is closer to the second ferromagnetic layer than the second magnetization region, and the third magnetization region is closer to the second ferromagnetic layer than the fourth magnetization region.

* * * * *